(12) United States Patent
Wang et al.

(10) Patent No.: US 10,971,624 B2
(45) Date of Patent: Apr. 6, 2021

(54) HIGH-VOLTAGE TRANSISTOR DEVICES WITH TWO-STEP FIELD PLATE STRUCTURES

(71) Applicant: Macronix International Co., Ltd., Hsinchu (TW)

(72) Inventors: Han-Lun Wang, Taoyuan (TW); An-Hung Lin, Taipei (TW); Wei-Chih Lin, Chiayi (TW); Xin-You Chen, New Taipei (TW); Bo-Jui Huang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 147 days.

(21) Appl. No.: 15/924,781

(22) Filed: Mar. 19, 2018

(65) Prior Publication Data

US 2019/0288112 A1    Sep. 19, 2019

(51) Int. Cl.
*H01L 29/76* (2006.01)
*H01L 29/78* (2006.01)
*H01L 21/761* (2006.01)
*H01L 29/40* (2006.01)
*H01L 29/417* (2006.01)
(Continued)

(52) U.S. Cl.
CPC ........ *H01L 29/7835* (2013.01); *H01L 21/761* (2013.01); *H01L 29/0878* (2013.01); *H01L 29/1045* (2013.01); *H01L 29/402* (2013.01); *H01L 29/4175* (2013.01); *H01L 29/41758* (2013.01); *H01L 29/517* (2013.01);
(Continued)

(58) Field of Classification Search
CPC ....... H01L 29/402–407; H01L 29/7833–7836; H01L 29/1083; H01L 29/665; H01L 21/823412; H01L 21/823807; H01L 29/66492; H01L 29/78621–78627; H01L 2029/7863; H01L 29/0856–0869; H01L 29/66681–66704; H01L 29/7816–7826; H01L 29/41758; H01L 29/66659; H01L 29/7835
See application file for complete search history.

(56) References Cited

U.S. PATENT DOCUMENTS 4,614,959 A * 9/1986 Nakagawa .......... H01L 29/1045
257/408
4,926,243 A * 5/1990 Nakagawa .......... H01L 27/088
257/659
(Continued)

*Primary Examiner* — Mary A Wilczewski
*Assistant Examiner* — Tsz K Chiu
(74) *Attorney, Agent, or Firm* — Fish & Richardson P.C.

(57) ABSTRACT

High-voltage transistor devices with two-step field plate structures and methods of fabricating the transistor devices are provided. An example high voltage transistor device includes: a gate electrode disposed over a substrate between a source region and a drain region, a first film laterally extending from over the gate electrode to over a drift region laterally arranged between the gate electrode and the drain region, a second film laterally extending over a portion of the drift region adjacent to the drain region and away from the gate electrode, and a field plate laterally extending from over the first film to over the second film. A first thickness vertically from a top surface of the gate electrode to a bottom surface of the field plate is smaller than a second thickness vertically from a top surface of the portion of the drift region to the bottom surface of the field plate.

20 Claims, 30 Drawing Sheets

(51) Int. Cl.
    *H01L 29/51*    (2006.01)
    *H01L 29/66*    (2006.01)
    *H01L 29/10*    (2006.01)
    *H01L 29/08*    (2006.01)

(52) U.S. Cl.
    CPC .. *H01L 29/66659* (2013.01); *H01L 29/66689* (2013.01); *H01L 29/7816* (2013.01)

(56) References Cited

U.S. PATENT DOCUMENTS

| | | | |
|---|---|---|---|
| 8,916,440 B2* | 12/2014 | Clark, Jr. | H01L 29/7817 257/335 |
| 9,590,053 B2 | 3/2017 | Chou et al. | |
| 2006/0113625 A1* | 6/2006 | Bude | H01L 29/1083 257/491 |
| 2006/0175670 A1* | 8/2006 | Tsubaki | H01L 29/404 257/409 |
| 2008/0014690 A1* | 1/2008 | Chu | H01L 29/66659 438/197 |
| 2008/0023785 A1* | 1/2008 | Hebert | H01L 21/26513 257/492 |
| 2012/0228704 A1 | 9/2012 | Ju | |
| 2012/0273879 A1* | 11/2012 | Mallikarjunaswamy | H01L 29/0692 257/335 |
| 2014/0035032 A1* | 2/2014 | Korec | H01L 29/0626 257/337 |
| 2014/0042538 A1* | 2/2014 | Li | H01L 29/7835 257/336 |
| 2017/0278963 A1* | 9/2017 | Liu | H01L 21/76897 |
| 2017/0373137 A1* | 12/2017 | Birner | H01L 21/26513 |

* cited by examiner

HIGH-VOLTAGE TRANSISTOR DEVICES WITH TWO-STEP FIELD PLATE STRUCTURES

BACKGROUND

High-voltage (HV) transistors, e.g., metal-oxide-semiconductor field-effect transistors (MOSFETs), can serve as high-voltage switches in high-voltage switching regulators and power management integrated circuits (ICs). To handle the high voltages involved in these and other high-voltage applications, the HV transistors are desirable to have high breakdown voltages and low on-resistances.

SUMMARY

The present disclosure describes implementations of high-voltage transistor devices with two-step field plate structures and methods of fabricating such devices, which can achieve high breakdown voltages and low on-resistances.

One aspect of the present disclosure features a high voltage transistor device including: a gate electrode disposed over a semiconductor substrate between a source region and a drain region; a first film laterally extending from over the gate electrode to over a drift region laterally arranged between the gate electrode and the drain region; a second film laterally extending over a portion of the drift region that is adjacent to the drain region and away from the gate electrode; and a field plate laterally extending from over the first film to over the second film. A first thickness defined vertically from a top surface of the gate electrode to a bottom surface of the field plate is smaller than a second thickness defined vertically from a top surface of the portion of the drift region to the bottom surface of the field plate, the first thickness including a thickness of the first film and the second thickness including a thickness of the second film.

The first film can laterally extend over the portion of the drift region, and the first thickness can be identical to the thickness of the first film, and the second thickness can be no less than a sum of the thickness of the first film and the thickness of the second film.

In some implementations, the second film is formed over the first film and under the field plate. The field plate can include a first conductive layer over the second film and a second conductive layer conformally over the first film and the first conductive layer. The high voltage transistor device can further include a polysilicon layer between the second film and the first conductive layer. The first conductive layer can include metal silicide, and the second conductive layer comprises metal. The high voltage transistor device can further include metal silicide layers formed on the source region, the drain region, and a portion of the gate electrode that is uncovered by the first film.

In some implementations, the first film is formed over the second film and under the field plate. The second film can include a conductive layer having a same thickness and a same material as the gate electrode. The conductive layer and the gate electrode can be made of polysilicon. In some examples, the high voltage transistor device further includes a first dielectric layer between the gate electrode and the drift region, and the second film includes a second dielectric layer between the conductive layer and the portion of the drift region, and the second dielectric layer has a same material and a same thickness as the first dielectric layer.

In some examples, the second film includes a first portion covered by the first film and a second portion covered by a metallic layer, the second portion laterally abutting the first portion and closer to the drain region than the first portion. The high voltage transistor device can further include a polysilicon layer between the field plate and the first film, and the field plate can have a same material and a same thickness as the metallic layer. The high voltage transistor device can further include respective metallic layers on the source region, the drain region, and a portion of the gate electrode that is uncovered by the first film, the respective metallic layers having the same material and the same thickness as the metallic layer.

In some cases, the high voltage transistor device further includes: a source metallic contact coupled to the source region and a metallic line layer configured to couple the field plate to the source metallic contact. In some cases, the high voltage transistor device further includes: a gate metallic contact coupled to the gate electrode and a metallic line layer configured to couple the field plate to the gate metallic contact.

The high voltage transistor device can be configured to be one of a low-side switch, a high-side switch, and a fully isolated switch. The first film can include one or more dielectric layers including a silicide blocking layer, and the second film can include one or more one dielectric layer including a field plate etch stop layer. The first film can cover an edge of the gate electrode, and the second film can be away from the edge of the gate electrode and laterally abuts an edge of the drain region.

In some cases, the high voltage transistor device further includes: a plurality of metallic contacts vertically arranged within an inter-level dielectric (ILD) layer and formed on the source region, the gate electrode, and the drain region. In some cases, the high voltage transistor device further includes: sidewall spacers arranged along sidewalls of the gate electrode and laterally separating the gate electrode from the first film and the field plate.

Another aspect of the present disclosure features a method of fabricating a high voltage transistor device, including: forming source and drain regions in a semiconductor substrate; forming a gate electrode over the semiconductor substrate between the source region and the drain region; forming a first film laterally extending from over the gate electrode to over a drift region laterally arranged between the gate electrode and the drain region; forming a second film laterally extending over a portion of the drift region that is adjacent to the drain region and away from the gate electrode; and forming a field plate laterally extending from over the first film to over the second film. A first thickness defined vertically from a top surface of the gate electrode to a bottom surface of the field plate is smaller than a second thickness defined vertically from a top surface of the portion of the drift region to the bottom surface of the field plate, the first thickness including a thickness of the first film and the second thickness including a thickness of the second film.

The thickness of the first film can be determined based on at least one of a predetermined breakdown voltage, a doping concentration of the drift region, or a drift length from the gate electrode to the drain region. The thickness of the second film can be determined based on the thickness of the first film, the predetermined breakdown voltage, the doping concentration of the drift region, the drift length, or an on-resistance of the transistor device, and the first film and the second film can be configured such that a substantially uniform electric field is formed on the field plate and a breakdown voltage of the transistor device is higher than the predetermined breakdown voltage.

In some implementations, forming the first film includes forming the first film laterally extending over the portion of the drift region, and the first thickness is identical to the thickness of the first film, and the second thickness is no less than a sum of the thickness of the first film and the thickness of the second film.

In some examples, forming the second film includes forming the second film over the first film. The method can include forming a first conductive layer selectively on the source region, the gate region, the drain region, and the second film. Forming the field plate can include forming the first conductive layer on the second film and forming a second conductive layer conformally over the first film and the first conductive layer on the second film. The method can further include: forming a polysilicon layer between the second film and the first conductive layer.

In some examples, forming the gate electrode and the second film includes: sequentially forming a dielectric layer and a conductive layer selectively on a first portion of the drift region as the gate electrode and on a second portion of the drift region as the second film, and forming the first film comprises forming the first film over the second film. Forming the first film can include forming the first film on one part of the second film. The method can include forming a polysilicon layer over the first film. Forming the field plate can include: forming a metallic layer over the polysilicon layer and the other part of the second film laterally abutting the one part of the second film and being adjacent to the drain region. Forming the metallic layer can include forming the metallic layer selectively on the source region, the gate electrode, and the drain region.

In some cases, the method further includes: forming a metal contact coupled to one of the source region and the gate electrode; and forming a metal line layer coupling the metal contact to the field plate.

In some cases, the method further includes: forming an inter-level dielectric (ILD) layer over the source region, the gate electrode, and the drain region; forming, in the ILD layer, a plurality of metal contacts vertically coupled to the source region and the drain region; and forming a metal line layer on the ILD layer and coupling the metal contact for the field plate to the metal contact for the source region.

In some cases, the method further includes: forming an inter-level dielectric (ILD) layer over the source region, the gate electrode, and the drain region; forming, in the ILD layer, a plurality of metal contacts vertically coupled to the source region, the gate electrode, and the drain region; and forming a metal line layer on the ILD layer and coupling the metal contact for the field plate to the metal contact for the gate electrode.

Ins some cases, the method further includes: forming an inter-level dielectric (ILD) layer over the semiconductor substrate; and forming one or more metal structures within the ILD layer, the one or more metal structures including the field plate over the first film and the second film and a plurality of metal contacts vertically coupled to the source region and the drain region.

A further aspect of the present disclosure features a high voltage transistor device including: a source region in a well of a first dopant type in a semiconductor substrate; a doping drift region of a second dopant type in the semiconductor substrate; a drain region of the second dopant type in the doping drift region; a gate electrode disposed via a gate dielectric layer over the semiconductor substrate between the source region and the drain region; a first film region laterally extending from over the gate electrode to over a first portion of the doping drift region between the gate electrode and the drain region; a second film region laterally extending over a second portion of the doping drift region, the second portion of the doping drift region laterally abutting the first portion of the doping drift region at a first end and being adjacent to the drain region at a second end; a field plate laterally extending from over the first film region to over the second film region; and a metal line layer coupling the field plate to one of the source region and the gate electrode. The second film region has a thickness larger than the first film region.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIG. 2A-1 illustrates a cross-sectional view of a low-side switch LDMOS transistor device with a first exemplary two-step field plate structure, according to one or more implementations.

FIG. 2A-2 is a flowchart showing salient steps of an exemplary fabrication process for fabricating the transistor device of FIG. 2A-1, according to one or more implementations.

FIG. 2B-1 illustrates a cross-sectional view of an example high-side switch LDMOS transistor device with the first exemplary field plate structure of FIG. 2A-1, according to one or more implementations.

FIG. 2B-2 is a flowchart showing salient steps of an exemplary fabrication process for fabricating the transistor device of FIG. 2B-1, according to one or more implementations.

FIG. 2C-1 illustrates a cross-sectional view of an example fully isolated switch LDMOS transistor device with the first exemplary field plate structure of FIG. 2A-1, according to one or more implementations.

FIG. 2C-2 is a flowchart showing salient steps of an exemplary fabrication process for fabricating the transistor device of FIG. 2C-1, according to one or more implementations.

FIG. 4A-1 illustrates a cross-sectional view of a low-side switch LDMOS transistor device with a second exemplary two-step field plate structure, according to one or more implementations.

FIG. 4A-2 is a flowchart showing salient steps of an exemplary fabrication process for fabricating the transistor device of FIG. 4A-1, according to one or more implementations.

FIG. 4B-1 illustrates a cross-sectional view of an example high-side switch LDMOS transistor device with the second exemplary field plate structure of FIG. 4A-1, according to one or more implementations.

FIG. 4B-2 is a flowchart showing salient steps of an exemplary fabrication process for fabricating the transistor device of FIG. 4B-1, according to one or more implementations.

FIG. 4C-1 illustrates a cross-sectional view of an example fully isolated switch LDMOS transistor device with the second exemplary field plate structure of FIG. 4A-1, according to one or more implementations.

FIG. 4C-2 is a flowchart showing salient steps of an exemplary fabrication process for fabricating the transistor device of FIG. 4C-1, according to one or more implementations.

FIG. 6A-1 illustrates a cross-sectional view of a low-side switch LDMOS transistor device with a third exemplary two-step field plate structure, according to one or more implementations.

FIG. 6A-2 is a flowchart showing salient steps of an exemplary fabrication process for fabricating the transistor device of FIG. 6A-1, according to one or more implementations.

FIG. 6B-1 illustrates a cross-sectional view of an example high-side switch LDMOS transistor device with the third exemplary field plate structure of FIG. 6A-1, according to one or more implementations.

FIG. 6B-2 is a flowchart showing salient steps of an exemplary fabrication process for fabricating the transistor device of FIG. 6B-1, according to one or more implementations.

FIG. 6C-1 illustrates a cross-sectional view of an example fully isolated switch LDMOS transistor device with the third exemplary field plate structure of FIG. 6A-1, according to one or more implementations.

FIG. 6C-2 is a flowchart showing salient steps of an exemplary fabrication process for fabricating the transistor device of FIG. 6C-1, according to one or more implementations.

DETAILED DESCRIPTION

Figure 1:
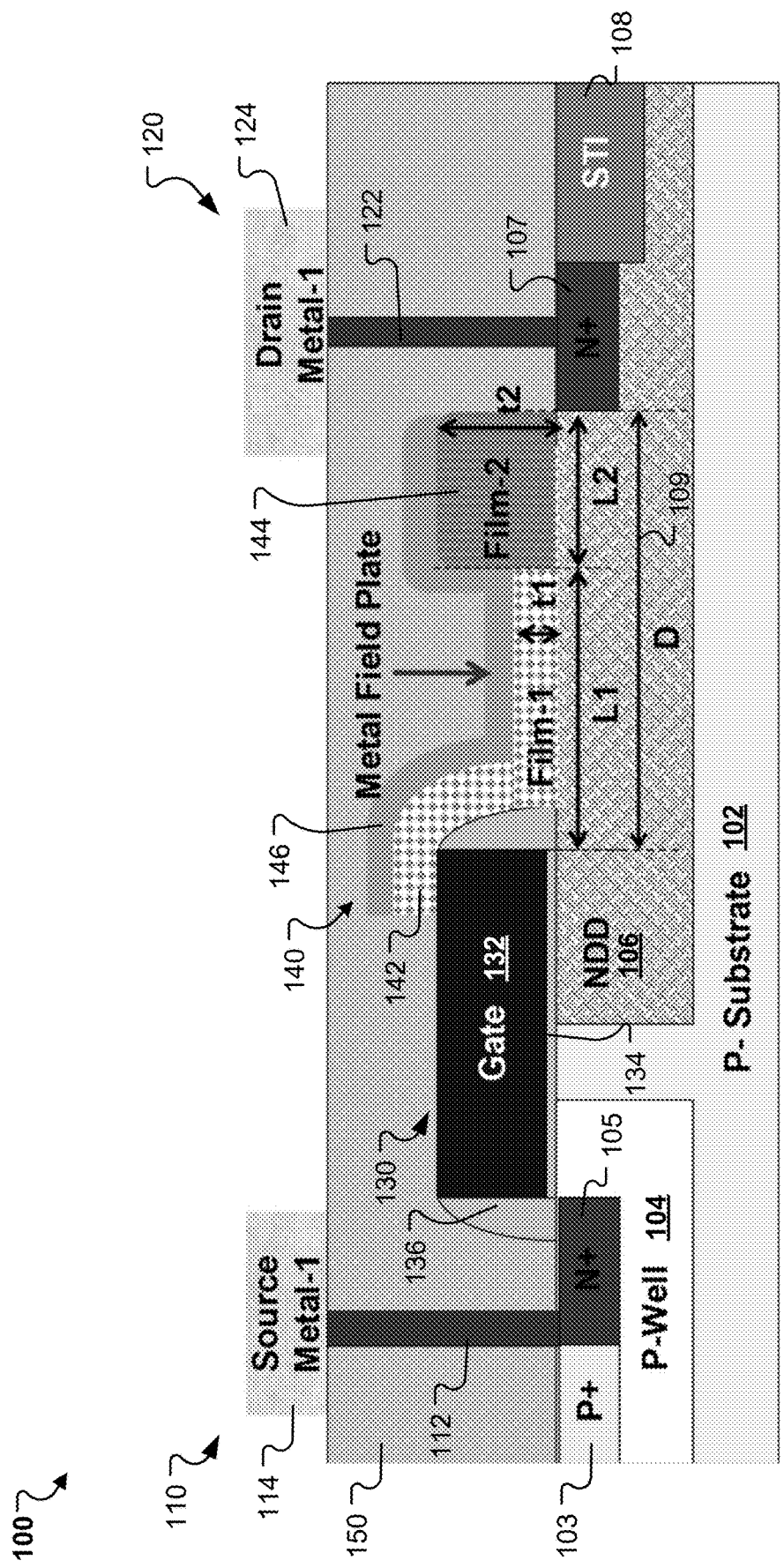
FIG. 1 illustrates a cross-sectional view of an exemplary high-voltage transistor device with a two-step field plate structure, according to one or more implementations.

Implementations of the present disclosure provide high voltage transistor devices with high breakdown voltages and a low on-resistances. A two-step field plate structure can be used in a high voltage transistor device to improve the high breakdown voltage and lower the on-resistance. The first step field plate structure includes a field plate and a first film region and is configured to reduce an electric field of an edge of a gate side of the transistor device. The second step field plate structure includes the field plate and a second film region and is configured to reduce an electric field between the field plate edge and a drain side of the transistor device. As a voltage potential between the drain side and the field plate is larger than a voltage potential between the gate side edge and the field plate, the second film region is configured to be thicker than the first film region.

The on-resistance of a transistor device is associated with a concentration of a doping drift region and a drift length from the gate side to the drain side, while the breakdown voltage of a transistor device is associated with the concentration of the doping drift region, the drift length, and the properties, e.g., the thicknesses, of the first film region and the second film region. Thus, a two-step field plate structure enables reduction of the on-resistance, e.g., by increasing the concentration of the drift region while maintaining high breakdown voltage, e.g., by controlling the properties of the first film region and the second film region.

The technology disclosed herein can optimize the on-resistance and breakdown voltage of high voltage transistor devices without extra masks (e.g., photoresist masks). The high voltage transistor devices can be fabricated by standard processes, for example, triple well process, BCD (Bipolar-complementary metal-oxide-semiconductor (CMOS)—double-diffused metal-oxide-semiconductor (DMOS)) process, non-epitaxially-grown layer (non-EPI) process with triple well process or twin well process, and/or single poly or double poly process. The high voltage transistor devices can be low-side switch MOS transistors, high-side switch MOS transistors, or full isolated switch MOS transistors. The high voltage transistors can be n-channel MOS (NMOS) transistors, p-channel MOS (PMOS) transistors, or CMOS transistors. The technology can be applied to any suitable structure, any suitable process and/or any suitable operation voltage. Besides high voltage devices, the technology can be also used for DC (direct current) application and/or low voltage applications.

The technology can be applied to any suitable transistor devices in any suitable substrates. For illustration purposes only, some examples in the following description are directed to n-channel laterally-diffused (LD) MOSFET (or LDMOS transistor) as one type of high voltage transistor. The n-channel LDMOS transistor can be located in a p-type semiconductor substrate or alternatively into a p-type epitaxial layer formed on a substrate. Some examples in the following description are directed to fabricating a single high voltage transistor by a fabrication process, and it should be understood that a plurality of transistors can be formed simultaneously across a semiconductor wafer serving as the substrate.

FIG. 1 illustrates a cross-sectional view of an exemplary high voltage (HV) transistor device 100 with a two-step field plate structure, according to one or more implementations.

The HV transistor device 100 can be an LDMOS transistor. The HV transistor device 100 is formed in a p-type semiconductor substrate 102. The p-type semiconductor substrate 102 can be a p-type silicon wafer or a p-type epitaxial layer formed on a substrate. The p-type semiconductor substrate 102 can have a p-type doping concentration of $10^{14}$ cm$^{-3}$ to $10^{16}$ cm$^{-3}$.

A P-well 104 is implanted and diffused with a higher p-type doping concentration than the p-type semiconductor substrate 102, e.g., $10^{16}$ cm$^{-3}$ to $10^{18}$ cm$^{-3}$, in the semiconductor substrate 102. Heavily-doped P+ body contact region 103, e.g., with a p-type doping concentration of $10^{19}$ cm$^{-3}$ to $10^{21}$ cm$^{-3}$, and heavily-doped N+ source region 105, e.g., with a n-type doping concentration of $10^{19}$ cm$^{-3}$ to $10^{21}$ cm$^{-3}$ are formed in the P-well 104. The P+ body contact region 103 can be further from a gate than the N+ source region 105. The P-well 104 can extend laterally beyond and vertically below the P+ body contact region 103 and the N+ source region 105. The P+ body contact region 103 and the N+ source region 105 are in direct electrical contact with one another.

A n-type doping drifting (NDD) region 106 is implanted and diffused with a higher n-type doping concentration, e.g., $10^{16}$ cm$^{-3}$ to $10^{18}$ cm$^{-3}$, in the p-type substrate 102. The P-well 104 can be laterally separated from the NDD region 106. The NDD region 106 contains a heavily-doped N+ drain region 107, e.g., with a n-type doping concentration of $10^{19}$ cm$^{-3}$ to $10^{21}$ cm$^{-3}$. The N+ drain region 107 can be more heavily doped than the NDD region 106.

Along the periphery of the transistor device 100, a shallow trench isolation (STI) 108 is formed in the p-type semiconductor substrate 102. The STI 108 electrically isolates the transistor device 100 from other transistor devices and devices formed on the p-type semiconductor substrate 102. In some implementations, a thick field oxide (FOX) layer is formed as an isolation region, instead of the STI.

A gate structure 130 is disposed over the semiconductor substrate 102 at a position that is laterally arranged between the N+ source region 105 and the drain region 107. The gate structure 130 includes a gate electrode 132 that partially overlies the P-well 104 and the NDD 106. The gate electrode 132 is separated from the semiconductor substrate 102, the P-well 104 and the NDD region 106 by a gate dielectric layer 134. The gate dielectric layer 134 can include silicon dioxide ($SiO_2$) or a high-k dielectric material, e.g., a high dielectric constant greater than the dielectric constant (3.9) of silicon dioxide ($SiO_2$). The gate electrode 132 can include conductive polysilicon (poly) disposed over the gate dielectric layer 134. Sidewall spacers 136 adjacent sidewalls of the gate electrode 132 serve to self-align the source region 105 to the gate electrode 132 during fabrication. The sidewall spacers 136 can include silicon dioxide ($SiO_2$) or silicon dioxide ($SiO_2$) and silicon nitride (SiN).

An inter-level dielectric (ILD) 150 is disposed over the semiconductor substrate 102. The ILD 150 can include one or more dielectric layers, e.g., a stack of layers $SiO_2$/SiN/$SiO_2$. One or more conductive metal structures can be disposed within the ILD layer 150. In some implementations, a number of metal contacts are formed in the ILD layer 150 and configured to provide for a vertical connection between the source region 105, the drain region 107, and/or the gate electrode 132 and a metal interconnect line layer overlying the ILD layer 150. For example, the source region 105 is conductively coupled to a source metal line layer 114 via a source metal contact 112 to form a source side 110 of the transistor device 100. The drain region 107 is conductively coupled to a drain metal line layer 124 via a drain metal contact 122 to form a drain side 120 of the transistor device 100. The metal contacts can include titanium, titanium-nitride, and tungsten. The metal line layers can be a back-end-of-the-line (BEOL) layer. The metal of the metal lines can include aluminum cooper or cooper.

The gate electrode 132 abuts the source region 105 at one end and extends to over a first portion of the NDD region 106 at the other end. A second portion of the NDD region 106 from the other end of the gate electrode 132 to the drain region 107 abuts the first portion of the NDD region 106 and has a lateral distance D. The second portion of the NDD region 106 can be considered as a drift region 109 for charge carriers moving from the source region 105 to the drain region 107. An on-resistance of the transistor device 100 is associated with a doping concentration of the drift region 109 (i.e., the concentration of the NDD 106) and the lateral distance D. The higher the doping concentration of the drift region 109 is, the lower the on-resistance is; the longer the lateral distance D is, the higher the on-resistance is.

The transistor device 100 includes a two-step field plate structure 140 disposed within the ILD layer 150 overlying portions of the gate electrode 108 and the NDD region 106. The two-step field plate structure 140 includes a first film region 142 laterally extending from over a portion of the gate electrode 108 to over a first part of the drift region 109 and a second film region 144 laterally extending over a second part of the drift region 109 from the first part of the drift region 109 to the drain region 107. The second part of the drift region 109 can laterally abut the first portion of the drift region 109 at a first end and be adjacent to an edge of the drain region 107 at a second end. The second part of the drift region 109 can also abut the drain region 107.

The two-step field plate structure 140 further includes a field plate 146 laterally extending from over the first film region 142 to over the second film region 144. The first film region 142 conformally covers the portion of the gate electrode 132 and the sidewall spacer 136. The field plate 146 can conformally cover the first film region 142 and the second film region 144. The field plate 146 can include a conductive material, e.g., a metal. In some examples, the field plate 146 is the same conductive material as the metal contacts 112 and 122 and can be formed in the same manufacturing process. The first film region 142 and the second film region 144 are configured to separate the field plate 146 from the gate electrode 132 and the drift region 109. The first film region 142 can include one or more dielectric layers, e.g., $SiO_2$/SiN. The second film region 144 can also include one or more dielectric layers, e.g., $SiO_2$/SiN/$SiO_2$.

During operation, the field plate 146 is configured to act upon an electric field generated by the gate electrode 132 and the drain region 107. The field plate 146 can be configured to change a distribution of the electric field generated by the gate electrode 108 and the drain region 107 in the drift region 109, which can enhance an internal electric field of the drift region 109, thereby enhancing the breakdown voltage capability of the high voltage transistor device 100.

The first film region 142 and the corresponding field plate 146 covering the first film region 142 can be considered as a first step field plate structure, and the second film region 144 and the corresponding field plate 146 covering the second film region 144 can be considered as a second step field plate. The first step field plate structure is configured to reduce an electric field of an edge of the gate electrode 108. The second step field plate structure is configured to reduce an electric field between the field plate 146 and the drain region 107. As a voltage potential between the drain region 107 and the field plate 146 is larger than a voltage potential between the edge of the gate electrode 108 and the field plate 146, the second film region 144 is configured to be thicker than the first film region 142. The first film region 142 and the second film region 144 are configured to get a uniform electric field distribution across the field plate 146.

As illustrated in FIG. 1, the first film region has a length of L1 and a thickness of t1, and the second film region has a length of L2 and a thickness of t2. The distance D can be identical to a sum of L1 and L2. The thickness t2 of the second film region is larger than the thickness t1 of the first film region, e.g., t2>t1. In a particular example, a ratio of t2/t1 is within a range of 1.2 to 2.5.

Compared to a high voltage transistor device with one-step field plate structure, e.g., with only the first film region 142 and the field plate 146, the transistor device 100 with the two-step field plate structure 140 can further improve the breakdown voltage. Moreover, as discussed in further details in FIG. 8, the transistor device 100 can reduce the on-resistance while maintaining a high breakdown voltage.

The on-resistance of the transistor device 100 depends on the concentration of the drift region 109 (or the NDD region 106) and the drift length D, while the breakdown voltage of the transistor device 100 depends on the concentration of the drift region 109, the drift length D, and the properties of the first film region (t1, L1) and the second film region (t2, L2). The longer the drift length is, the higher on-resistance and the breakdown voltage will be. The higher the concentration of the drift region is, the lower the on-resistance and the breakdown voltage will be. As changing the properties of the first film region and the second film region can affect the breakdown voltage without affecting the on-resistance, the two-step field plate structure 140 can enable the transistor device 100 to reduce the on-resistance, e.g., by increasing the concentration of the drift region while maintaining high breakdown voltage, e.g., by controlling the properties of the second film region and/or the first film region.

Exemplary Transistor Devices and Fabrication Steps

In the following, a number of high voltage transistor devices (e.g., LDMOS transistors) with exemplary two-step field plate structures are described. For each two-step field plate structure, a transistor device can have different field plate biasing configurations. For illustration only, two biasing configurations are provided, including: 1) biasing the field plate by a source voltage from a source region and 2) biasing the field plate by a gate voltage from a gate electrode. Additionally, each transistor device can have different switching isolation configurations including a low-side switch, a high-side switch, and a fully isolated switch.

Transistor devices in FIGS. 2A-1, 2B-1, 2C-1 have the same field plate structure (a first exemplary two-step field plate structure 210), the same field plate biasing configuration (by a source voltage), but different isolation configurations (low-side, high-side, and fully isolated). Transistor devices in FIGS. 3A, 3B, 3C have the same field plate structure (the first exemplary two-step field plate structure 210), the same field plate biasing configuration (by a gate voltage), but different isolation configurations (low-side, high-side, and fully isolated). Transistor devices in FIGS. 4A-1, 4B-1, 4C-1 have the same field plate structure (a second exemplary two-step field plate structure 410), the same field plate biasing configuration (by a source voltage), but different isolation configurations (low-side, high-side, and fully isolated). Transistor devices in FIGS. 5A, 5B, 5C have the same field plate structure (the second exemplary two-step field plate structure 410), the same field plate biasing configuration (by a gate voltage), but different isolation configurations (low-side, high-side, and fully isolated). Transistor devices in FIGS. 6A-1, 6B-1, 6C-1 have the same field plate structure (a third exemplary two-step field plate structure 610), the same field plate biasing configuration (by a source voltage), but different isolation configurations (low-side, high-side, and fully isolated). Transistor devices in FIGS. 7A, 7B, 7C have the same field plate structure (the third exemplary two-step field plate structure 610), the same field plate biasing configuration (by a gate voltage), but different isolation configurations (low-side, high-side, and fully isolated).

Corresponding fabrication steps for fabricating the transistor devices are also provided. FIGS. 2A-2, 2B-2, 2C-2 illustrate steps for fabricating the transistor devices in FIGS. 2A-1, 2B-1, 2C-1, respectively. The transistor devices in FIGS. 3A, 3B, 3C can be fabricated using the substantially same steps as the transistor devices in FIGS. 2A-1, 2B-1, 2C-1. FIGS. 4A-2, 4B-2, 4C-2 illustrate steps for fabricating the transistor devices in FIGS. 4A-1, 4B-1, 4C-1, respectively. The transistor devices in FIGS. 5A, 5B, 5C can be fabricated using the substantially same steps as the transistor devices in FIGS. 4A-1, 4B-1, 4C-1. FIGS. 6A-2, 6B-2, 6C-2 illustrate steps for fabricating the transistor devices in FIGS. 6A-1, 6B-1, 6C-1, respectively. The transistor devices in FIGS. 7A, 7B, 7C can be fabricated using the substantially same steps as the transistor devices in FIGS. 6A-1, 6B-1, 6C-1.

Figures 1, 2A:
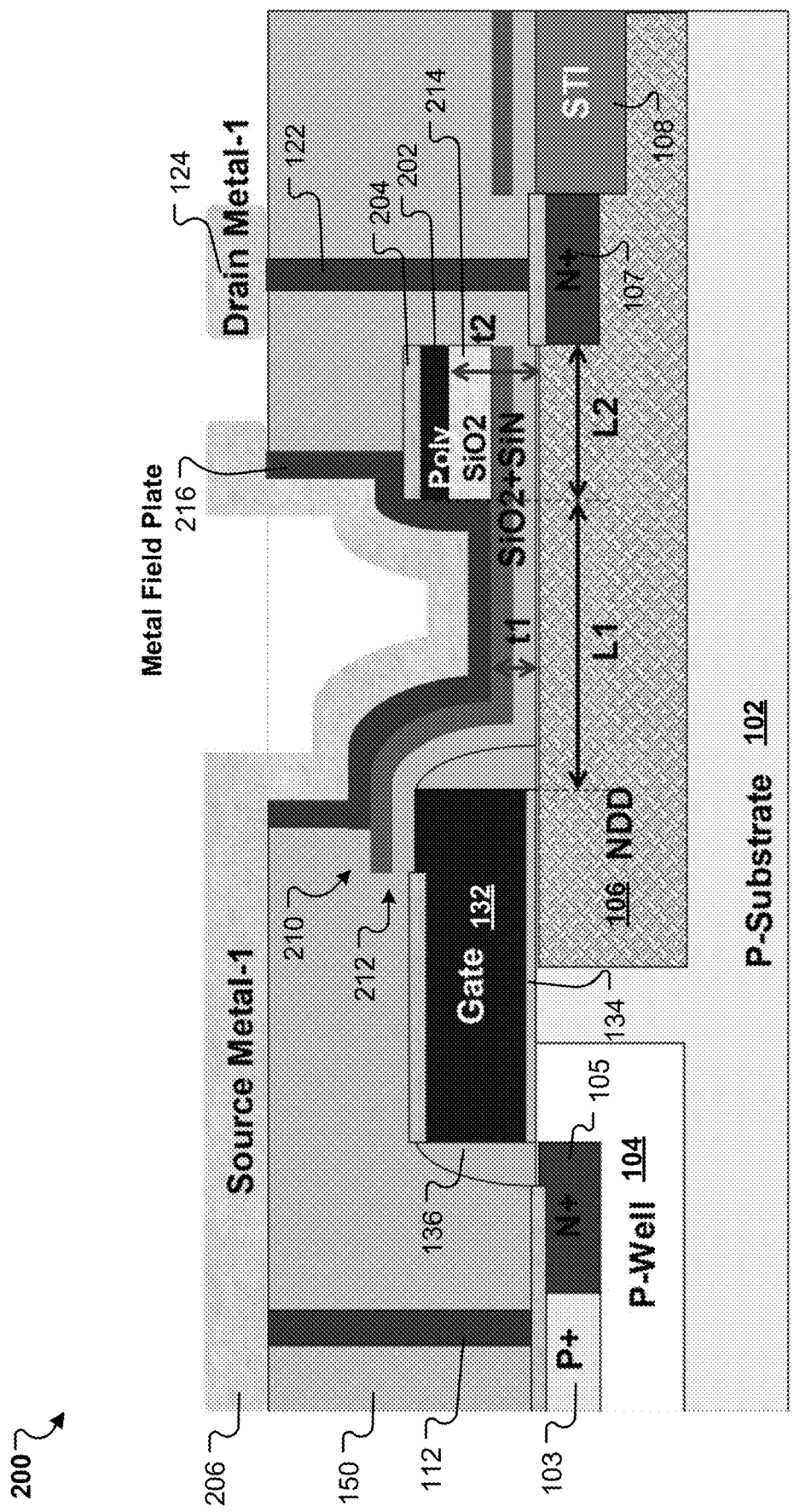

Referring to FIG. 2A-1, a transistor device 200 includes a two-step field plate structure 210. The field plate structure 210 can be the field plate structure 140 of FIG. 1. The field plate structure 210 includes a first layer 212, e.g., a $SiO_2/SiN$ bilayer. The first layer 212 extends laterally from over the gate electrode 132, the sidewall spacer 136 to over the NDD region 106. The field plate structure 210 includes a second layer 214, e.g., $SiO_2$, extending laterally from over a portion of the NDD region 106 to the drain region 107. The first layer 212 extends laterally over the portion of the NDD region 106 to the drain region 107. That is, the second layer 214 is formed over the first layer 212. In some examples, a dielectric layer same as the first layer 212 can also be formed on the STI 108 during manufacturing.

The field plate structure 210 also includes a metal field plate 216 overlying the first layer 212 and the second layer 214. A polysilicon layer 202 and a metal silicide (or metal polycide) 204 are formed between the second layer 214 and the metal field plate 216. Metal silicides of the same composition as the metal silicide 204 can also be selectively disposed over the body contact region 103 and the source region 105, the gate electrode 132 that is uncovered by the first layer 242, and the drain region 107. The metal silicide 204 can include cobalt-silicide, titanium-nitride/titanium-silicide, titanium-nitride/titanium/cobalt-silicide, cobalt-polycide or titanium-nitride/titanium-polycide, titanium-nitride/titanium/cobalt-polycide.

A first film region of the field plate structure 210 can include the first layer 212 and have a thickness of t1, and a second film region of the field plate structure 210 can include the first layer 212 and the second layer 214 and have a thickness of t2. As illustrated in FIG. 2A-1, the first film region covers a first portion of the NDD region 106 with a length of L1 and the second film region covers a second portion of the NDD region 106 with a length of L2. Accordingly, a first step field plate structure of the structure 210 includes the first film region and the metal field plate 216, and a second step field plate structure of the structure 210 includes the second film region, the metal silicide 204, and the metal field plate 216.

In a particular example, the transistor device 200 is configured for an operation voltage range of 6V to 60V. The first layer 212 includes a $SiO_2$ layer with a thickness of 400 Å to 1500 Å and a SiN layer with a thickness of 200 Å to 600 Å. The second layer 214 includes another $SiO_2$ layer with a thickness of 400 Å to 1000 Å. The polysilicon layer 202 has a thickness of 600 Å to 1200 Å. The first film region can have a length L1 of 0.2 μm to 3.0 μm, and the second film region can have a length L2 of 0.2 μm to 0.7 μm.

A metal line layer 206 is formed on the ILD layer 150 and conformally on the metal field plate 216. The metal line layer 206 can include aluminum or cooper. The metal line layer 206 is coupled to the source metal contact 112 that is coupled to the source region 105 via a metal silicide layer of the same composition as the metal silicide 204. Thus, the metal field plate 216 is coupled to the source region 105 via the metal line layer 206. By electrically coupling the metal field plate 216 and the metal silicide 204 to the source region 105, the field plate 216 and the metal silicide 204 are biased by a source voltage, which can provide the high voltage transistor device 200 with a low on-state resistance and low dynamic power dissipation. The low dynamic power dissipation can provide the transistor device 200 for good performance during high frequency switching applications (e.g., above 10 MHz).

The transistor device 200 is configured to be a low-side switch LDMOS, where the source region 105 and the p-substrate 102 have the same operation range, e.g., a switch connected to ground in an inverter. The source region 105 can be floating such that the source voltage on the source region 105 can change during switching cycles.

Figures 2, 2A:
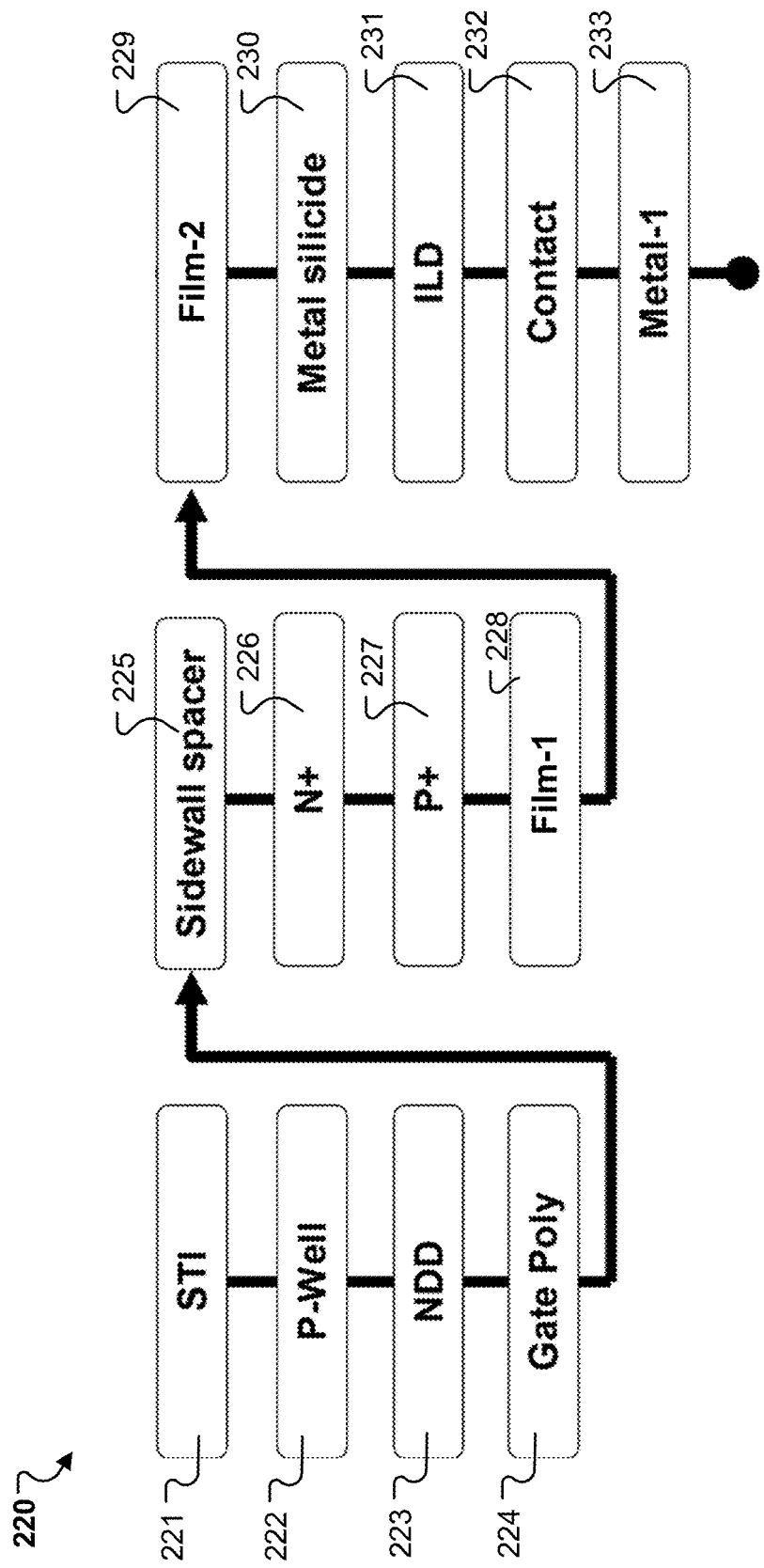

FIG. 2A-2 is a flowchart showing salient steps of an exemplary fabrication process 220 for fabricating the transistor device 200 of FIG. 2A-1. The process 220 may form the transistor device 200 using process steps that are used in standard CMOS semiconductor manufacturing processes. The salient steps of the fabrication process 220 are shown, depending on the circumstances some of the salient steps need not necessarily be performed, or, unless explicitly stated that one step precedes or follows another, may be performed in a different order than shown and described.

A p-type semiconductor substrate 102 is first provided, and a shallow trench isolation (STI) 108 is formed in the p-type semiconductor substrate 102 (221). A P-well 104 with a higher p-type doping concentration is formed in the substrate 102 (222) and a n-type doping drifting (NDD) region 106 is formed in the substrate 102 (223). Then a gate electrode 132, e.g., gate polysilicon (gate poly), is formed on the substrate 102 (224). The gate electrode 132 can be formed over portions of the P-well 104 and the NDD region 106. Sidewall spacers 136 are formed adjacent to sidewalls of the gate electrode 132 (225). Heavily-doped N+ source region 105 and N+ drain region 107 are formed in the P-well 104 and the NDD region 106, respectively (226). The sidewall spacer 136 serves to self-align the source region 105 to the gate electrode 132, such that the gate electrode 132 abuts the N+ source region 105. Heavily-doped P+ body contact region 103 is formed in the P-well 104 (227). The P+ body contact region 103 and the N+ source region 105 are in direct electrical contact with one another.

Next, a two-step field plate structure is formed. A first film region is first formed (228) by forming the first layer 212 laterally extending from over a portion of the gate electrode 132 to the drain region 107. A second film region is formed (229) by further forming the second layer 214 on the first layer 212 over a portion of the NDD region 106 adjacent to the drain region 107. Metal silicide 204 is formed (230) selectively on the second layer 214, the gate electrode 132, the P+ body contact region 103, the N+ source region 105, and the N+ drain region 107. In some examples, a polysilicon layer 202 is formed on the second layer 214 before forming the metal silicide, and the polysilicon layer 202 is between the metal silicide 204 and the second layer 214.

An inter-level dielectric (ILD) layer 150 is formed on the semiconductor substrate 102 (231). Then one or more metal structures including the metal contacts 112, 122, and the metal field plate 216 are formed within the ILD layer 150 (232). Particularly, the metal field plate 216 is conformally formed on the first layer 212 and the metal silicide 204 over the first film region and the second film region. Finally, a metal line layer is formed (233) on the ILD layer 150, which forms the source metal line layer 206 and the drain metal line layer 124. The metal field plate 216 is thus coupled to the source region 105 via the source metal line layer 206, the metal contact 112, and the metal silicide on the source region 105.

Figures 1, 2B:
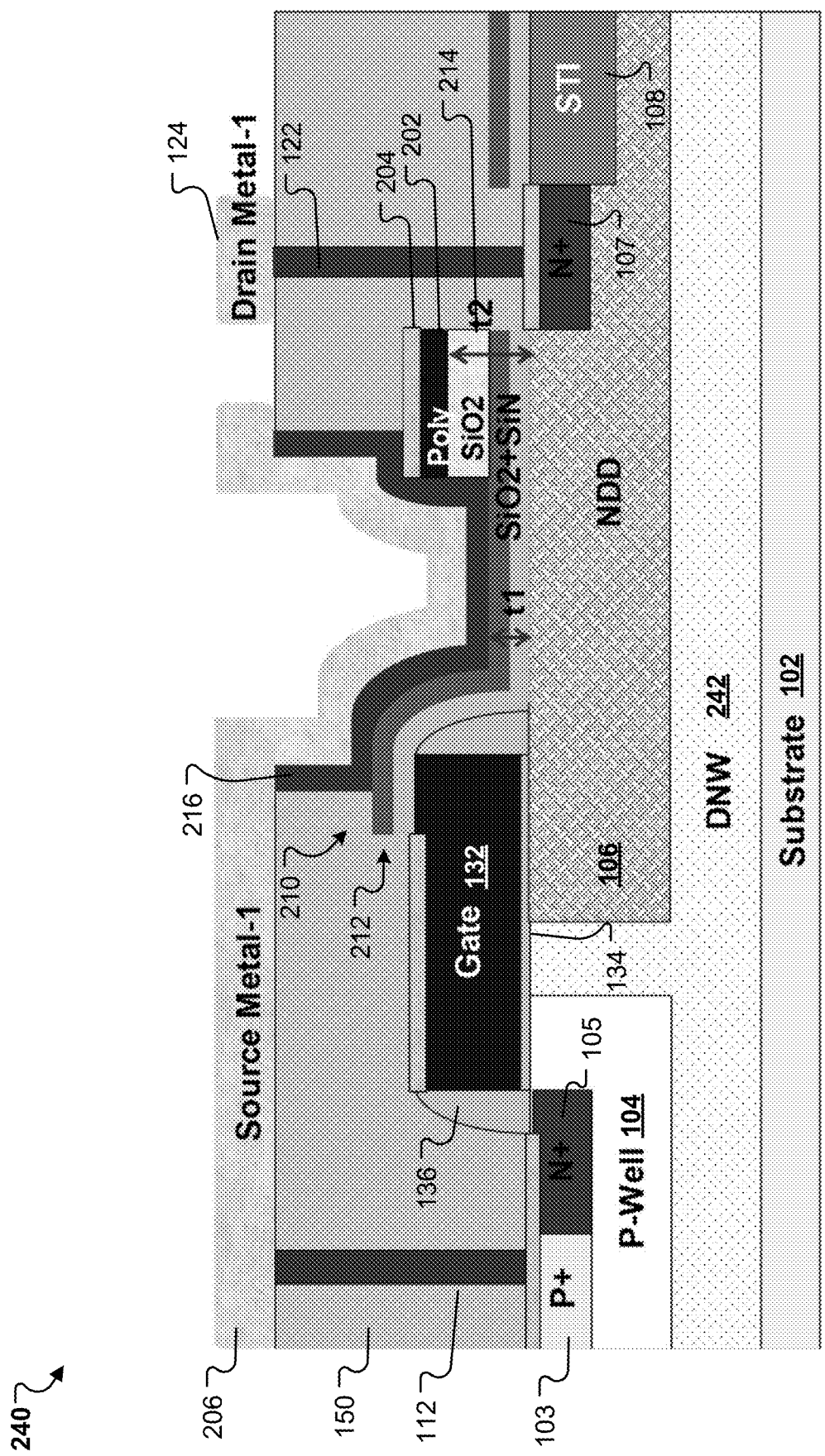
Figures 2, 2B:
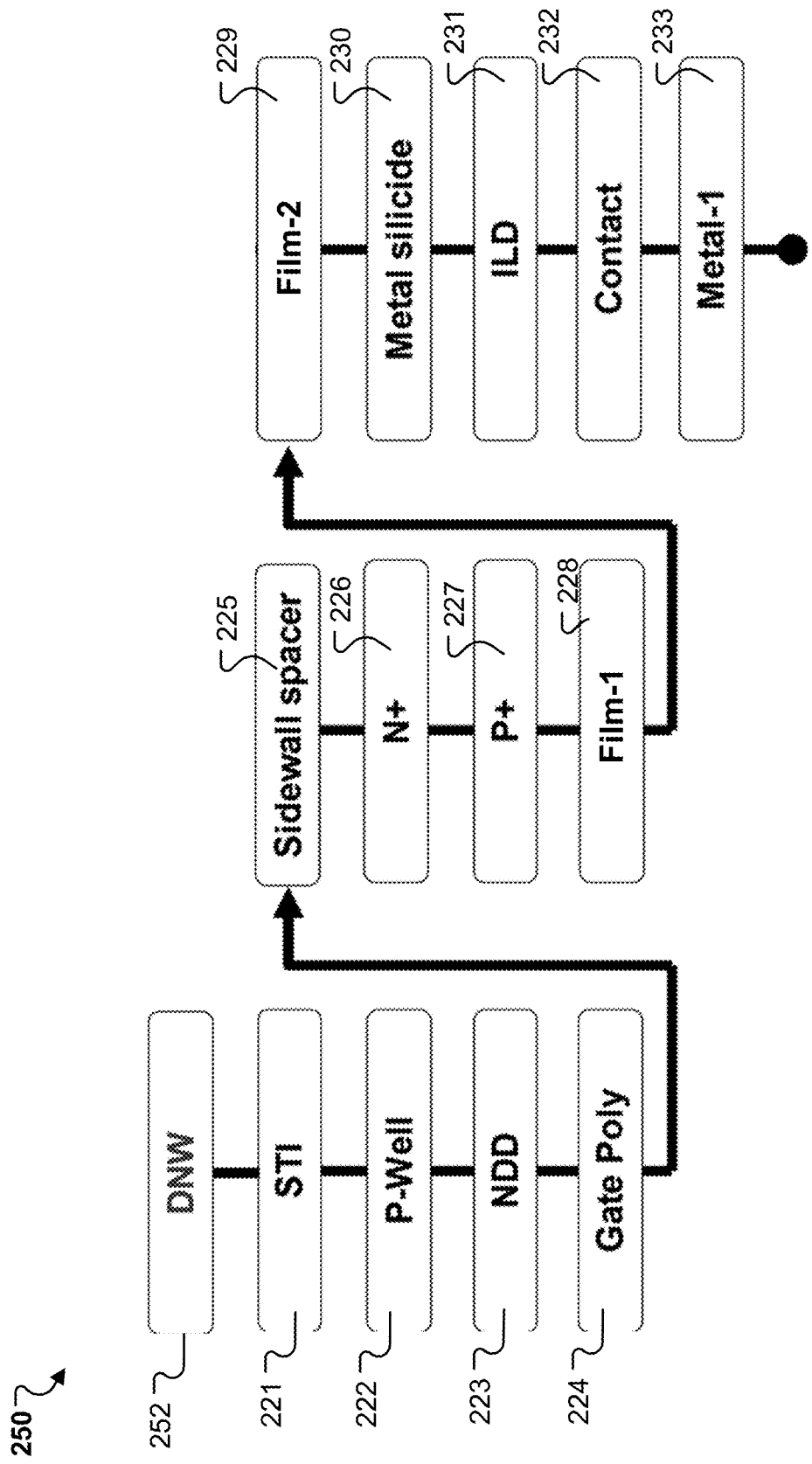

FIG. 2B-1 shows another high voltage transistor device 240 that is similar to the transistor device 200 of FIG. 2A-1, except that the transistor device 240 is configured as a high-side switch LDMOS while the transistor device 200 is configured as a low-side switch LDMOS.

The transistor device 240 can be a switch connected to VDD in an inverter. In this configuration, the source region 105 and the p-type substrate 102 can have different operation voltages. The source region 105 is connected to a source voltage. The transistor device 240 includes a deep n-type well (DNW) 242 to prevent the source voltage from being raised over the substrate voltage by preventing charge carriers from traveling from the source region 105 to the substrate 102. The P-well 104 and the NDD region 106 are formed in the DNW 242. The DNW 242 can have a n-type doping concentration lower than that of the NDD region 106, e.g., a doping concentration of $10^{15}$ $cm^{-3}$ to $10^{18}$ $cm^{-3}$.

FIG. 2B-2 is a flowchart showing salient steps of an exemplary fabrication process 250 for fabricating the transistor device of FIG. 2B-1. Compared to the fabrication process 220 of FIG. 2A-2, the fabrication process 250 includes step 252 for forming the DNW 242 on the semiconductor substrate 102 before performing the fabrication process 220.

Figures 1, 2C:
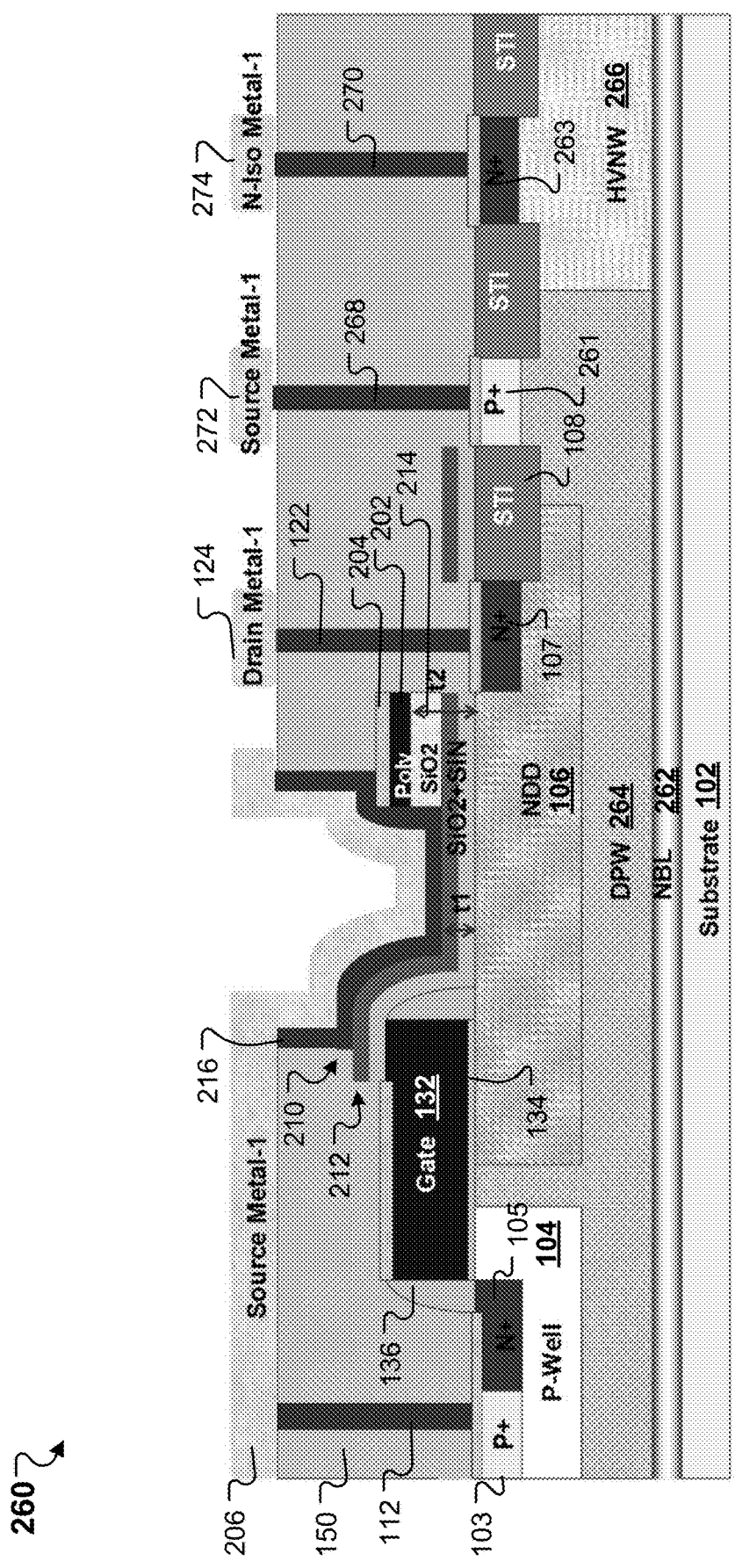
Figures 2, 2C:
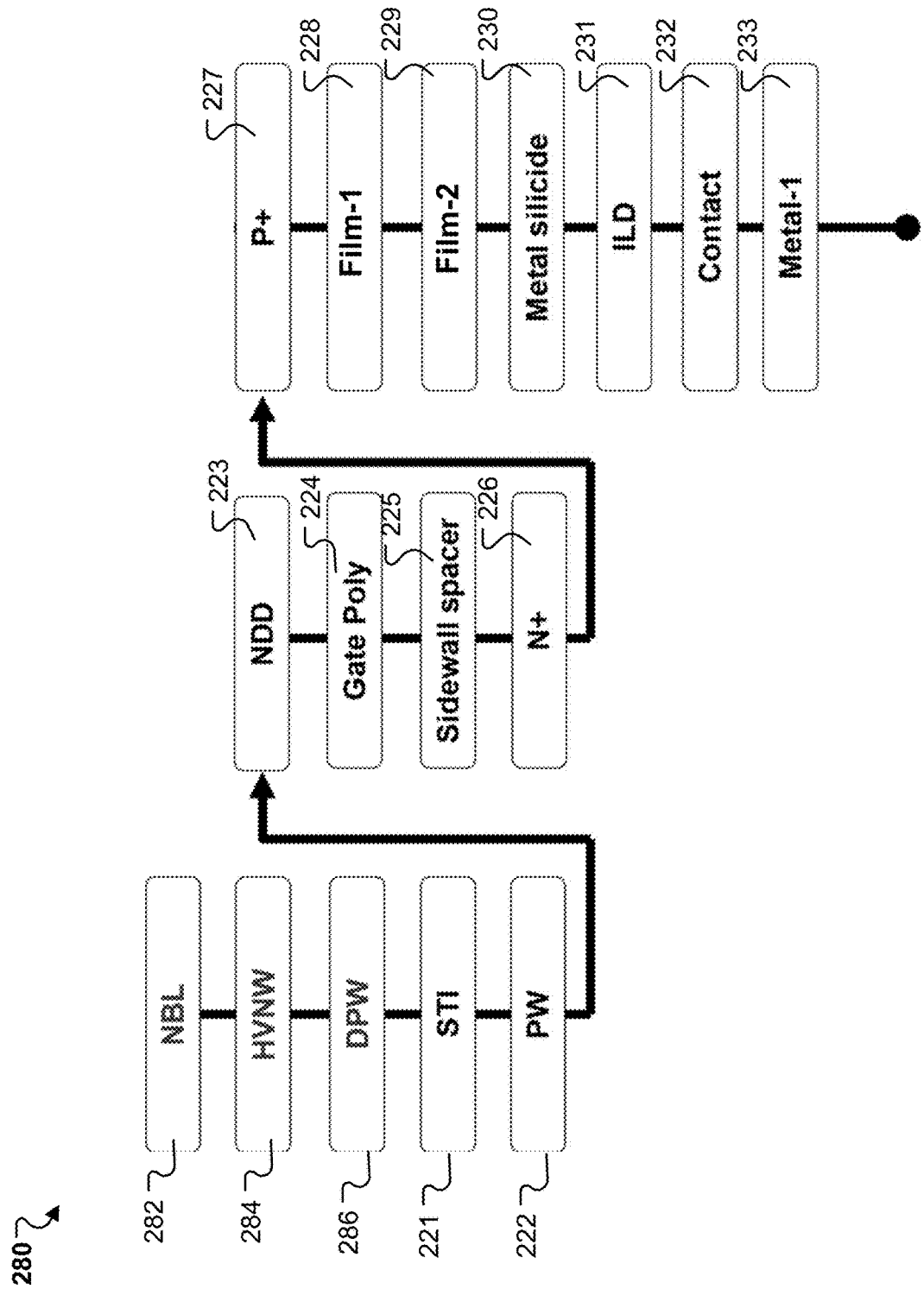

FIG. 2C-1 shows another high voltage transistor device 260 that is similar to the transistor device 200 of FIG. 2A-1, except that the transistor device 260 is configured as a fully isolated switch LDMOS while the transistor device 200 is configured as a low-side switch LDMOS.

The transistor device 260 is configured to be fully isolated from the substrate 102 to allow for independent biasing. The transistor device 260 can include a deep p-type well (DPW) 264 and an underlying oppositely n-type doped buried layer (NBL) 262 configured to provide for vertical isolation. The transistor device 260 further includes one or more additional STI regions 108 that laterally separate the drain region 107 from a p-type bulk region 261 and a buried layer 263 having n doping type. The bulk region 261 overlies the DPW 264 and the buried layer 263 overlies a high voltage n-type well (HVNW) region 266 that abuts the buried layer 253. Metal contacts 268 and 270 are configured to provide for biasing voltages to the bulk region 261 and the buried layer 263, respectively, so as to form junction isolation between the DPW 264 and the buried layer 263 and the HVNW region 266. The junction isolation allows the fully isolated, high voltage transistor device 260 to operate over a range of bias voltages. A source metal line layer 272 and an N-ISO metal line layer 274 are selectively formed on the metal contacts 268 and 270. The source region 105 and the substrate 102 can have different input voltages, and the drain region 107 and the buried layer 263 can have different input voltages.

In some examples, the DPW 264 can have a p-type doping concentration of $10^{15}$ cm$^{-3}$ to $10^{18}$ cm$^{-3}$. The NBL 262 can have an n-type doping concentration of $10^{16}$ cm$^{-3}$ to $10^{19}$ cm$^{-3}$. The HVNW 266 can have an n-type doping concentration of $10^{15}$ cm$^{-3}$ to $10^{18}$ cm$^{-3}$. The bulk region 261 can have the same p-type doping concentration as the P+ body contact region 103. The buried layer 263 can have the same n-type doping concentration as the N+ source region 105. Metal silicides can be also formed on the bulk region 261 and the buried layer 263.

FIG. 2C-2 is a flowchart showing salient steps of an exemplary fabrication process 280 for fabricating the transistor device 260 of FIG. 2C-1. Compared to the fabrication process 220 of FIG. 2A-2, the fabrication process 280 includes step 282 for forming the NBL 262 on the substrate 102, step 284 for forming the HVNW region 266 on the NBL 262, and step 286 for forming the DPW 264 on the NBL 262 before performing the fabrication process 220. When performing step 226, the buried layer 263 is also formed together with the N+ source region 105. When performing step 227, the bulk region 261 is also formed together with the P+ body contact region 103. When performing step 220, the metal silicides are also formed on the bulk region 261 and the buried layer 263.

Figure 3A:
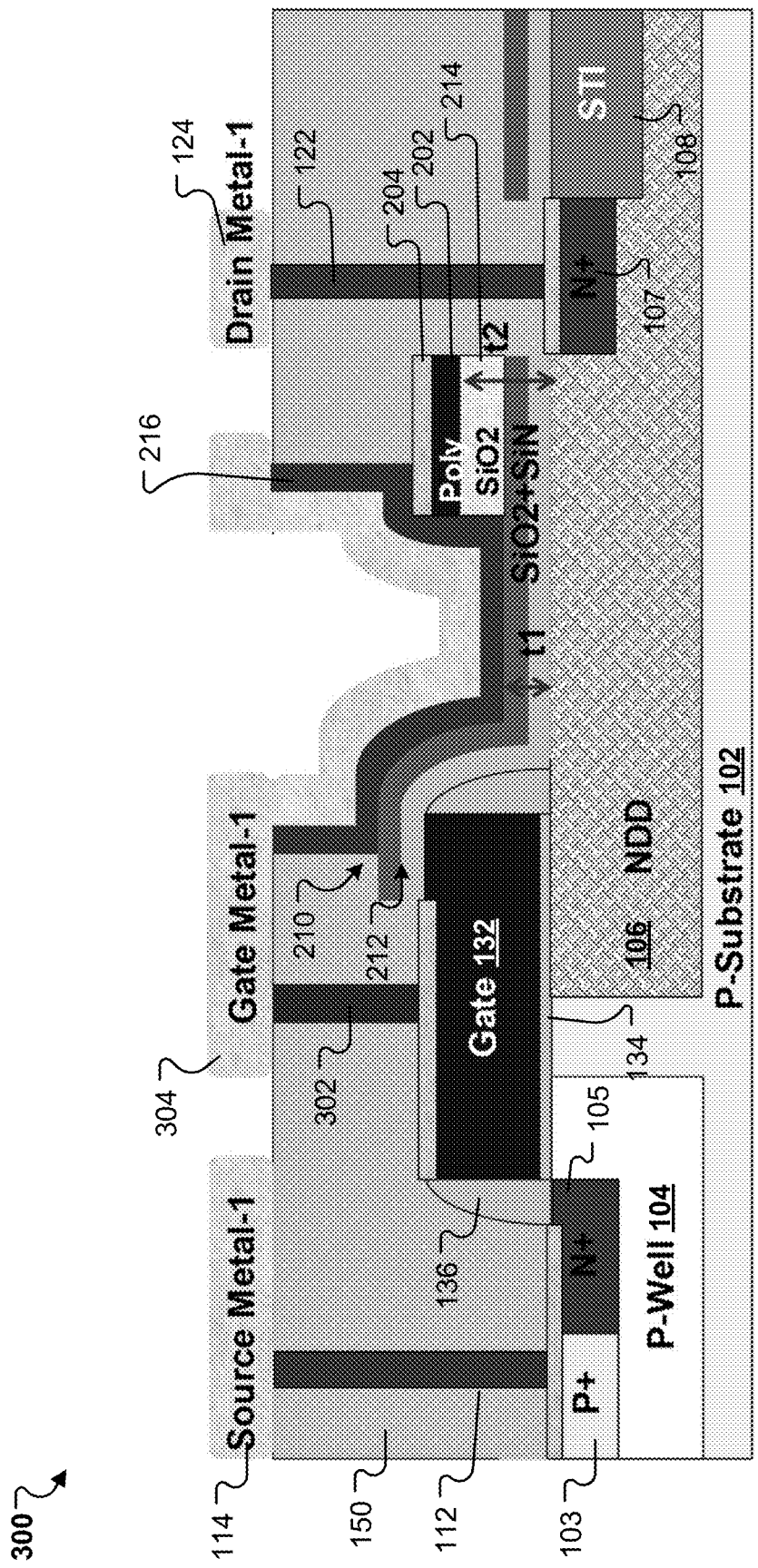
FIG. 3A illustrates a cross-sectional view of another low-side switch LDMOS transistor device with the first exemplary field plate structure of FIG. 2A-1, according to one or more implementations.

FIG. 3A illustrates a cross-sectional view of another low-side switch LDMOS transistor device 300 with the first exemplary field plate structure 210 of FIG. 2A-1. Compared to the transistor device 200 of FIG. 2A-1, the transistor device 300 has a different field plate biasing configuration. Instead of coupling the metal field plate 216 to the source region 105, the transistor device 300 is configured to couple the metal field plate 216 to the gate electrode 132 via a metal [conductive?]contact 302 within the ILD layer 150 and a gate metal line layer 304 overlying the ILD layer 150. The gate metal line layer 304 can conformally extend over the metal contact 302 to over the metal field plate 216.

By electrically coupling the metal field plate 216 to the gate electrode 132, the metal field plate 216 is biased by the gate voltage. Biasing the metal field plate 216 by the gate voltage provides the high voltage LDMOS device 300 with a low on-resistance vs. high breakdown voltage. The transistor device 300 having a gate bias field plate can be used in low frequency switching applications (e.g., below 10 MHz).

The transistor device 300 can be fabricated using the same process 220 for the transistor device 200. When performing step 232, the metal contact 302 is also formed together with other metal contacts 112 and 122. When performing step 233, the source metal layer 114 is formed over the metal contact 112 without connecting to the metal field plate 216, and the gate metal layer 304 is formed over the metal contact 302 and extends to overly the metal field plate 216.

Figure 3B:
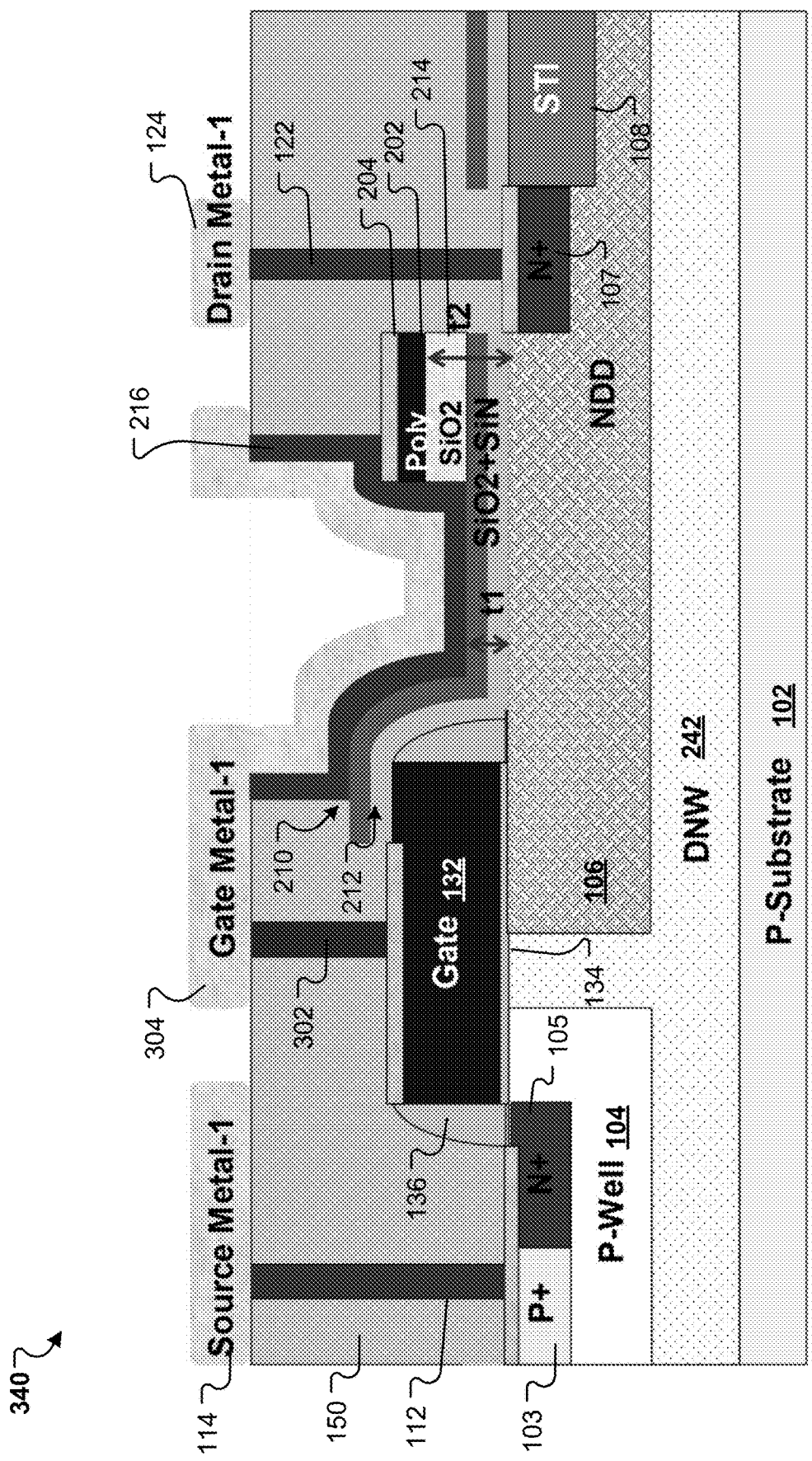
FIG. 3B illustrates a cross-sectional view of another high-side switch LDMOS transistor device with the first exemplary field plate structure of FIG. 2A-1, according to one or more implementations.

FIG. 3B illustrates a cross-sectional view of another high-side switch LDMOS transistor device 340 with the first exemplary field plate structure 210 of FIG. 2A-1. Compared to the transistor device 240 of FIG. 2B-1, the transistor device 340 has a different field plate biasing configuration. Instead of coupling the metal field plate 216 to the source region 105, the transistor device 340 is configured to couple the metal field plate 216 to the gate electrode 132 via a metal contact 302 within the ILD layer 150 and a gate metal line layer 304 overlying the ILD layer 150. The gate metal line layer 304 can conformally extend over the metal contact 302 to over the metal field plate 216.

The transistor device 340 can be fabricated using the same process 250 for the transistor device 240. When performing step 232, the metal contact 302 is also formed together with other metal contacts 112 and 122. When performing step 233, the source metal layer 114 is formed over the metal contact 112 without connecting to the metal field plate 216, and the gate metal layer 304 is formed over the metal contact 302 and extends to overly the metal field plate 216.

Figure 3C:
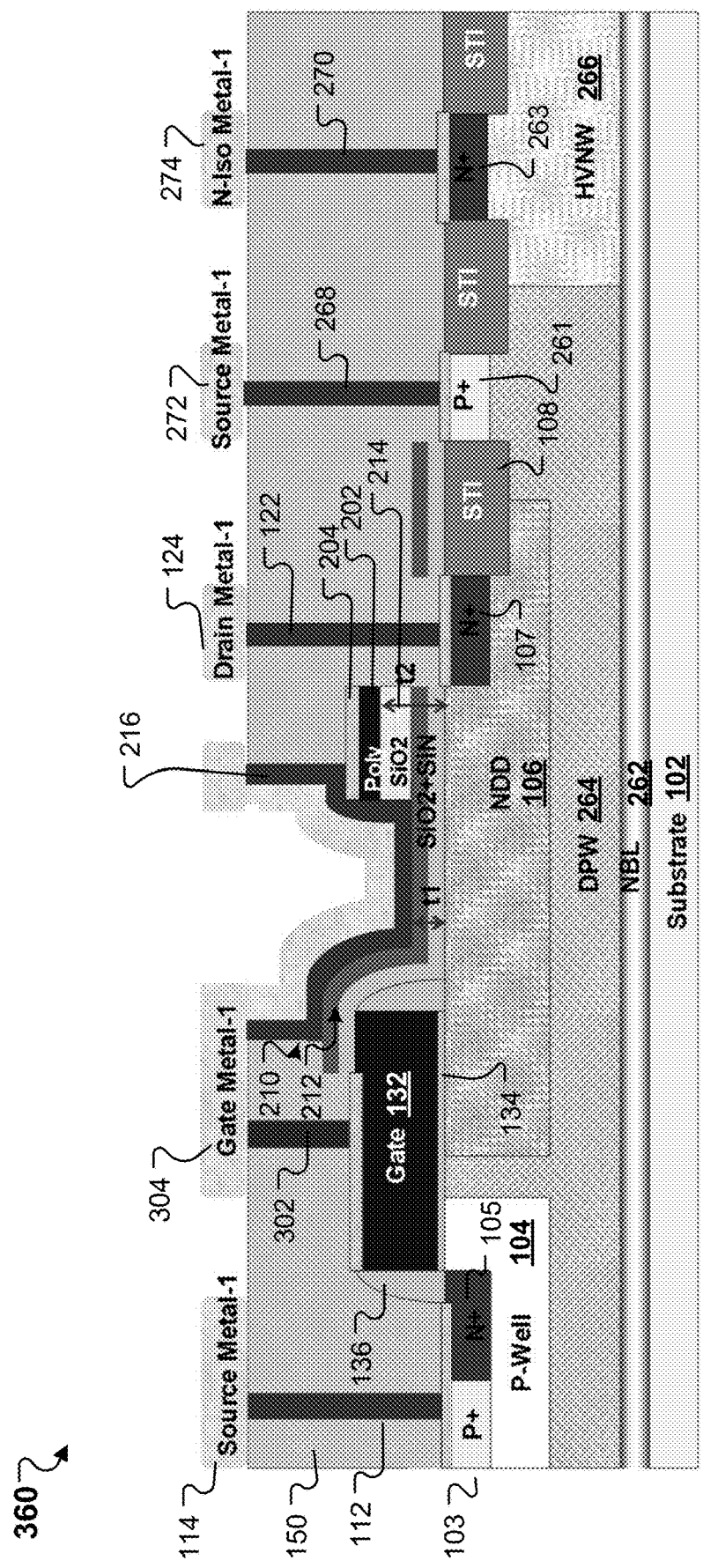
FIG. 3C illustrates a cross-sectional view of another fully isolated switch LDMOS transistor device with the first exemplary field plate structure of FIG. 2A-1, according to one or more implementations.

FIG. 3C illustrates a cross-sectional view of another fully isolated switch LDMOS transistor device 360 with the first exemplary field plate structure of FIG. 2A-1. Compared to the transistor device 260 of FIG. 2C-1, the transistor device 360 has a different field plate biasing configuration. Instead of coupling the metal field plate 216 to the source region 105, the transistor device 360 is configured to couple the metal field plate 216 to the gate electrode 132 via a metal contact 302 within the ILD layer 150 and a gate metal line layer 304 overlying the ILD layer 150. The gate metal line layer 304 can conformally extend over the metal contact 302 to over the metal field plate 216.

The transistor device 360 can be fabricated using the same process 280 for the transistor device 260. When performing step 232, the metal contact 302 is also formed together with other metal contacts 112 and 122. When performing step 233, the source metal layer 114 is formed over the metal contact 112 without connecting to the metal field plate 216, and the gate metal layer 304 is formed over the metal contact 302 and extends to overly the metal field plate 216.

Figures 1, 4A:
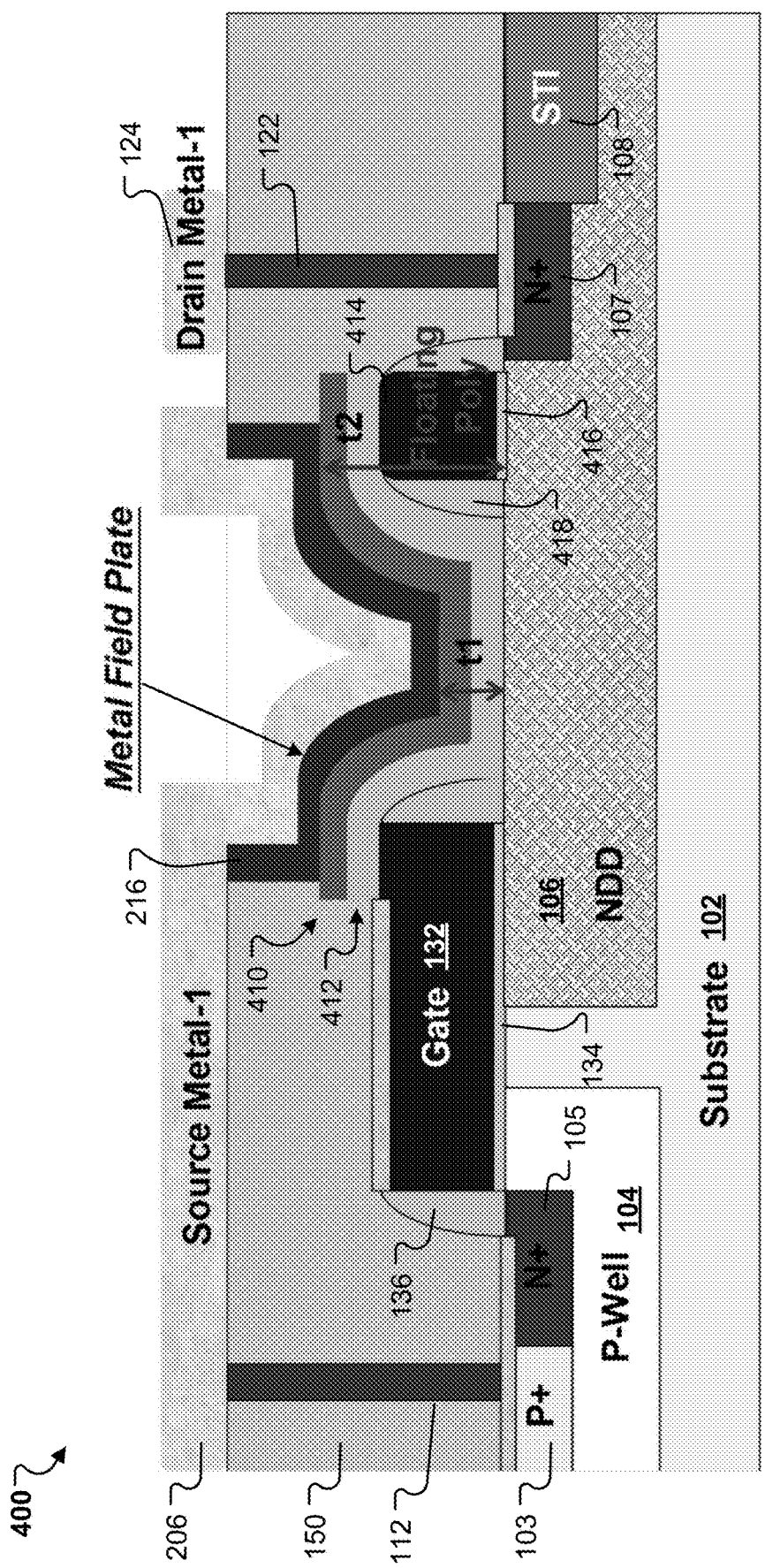
Figures 2, 4A:
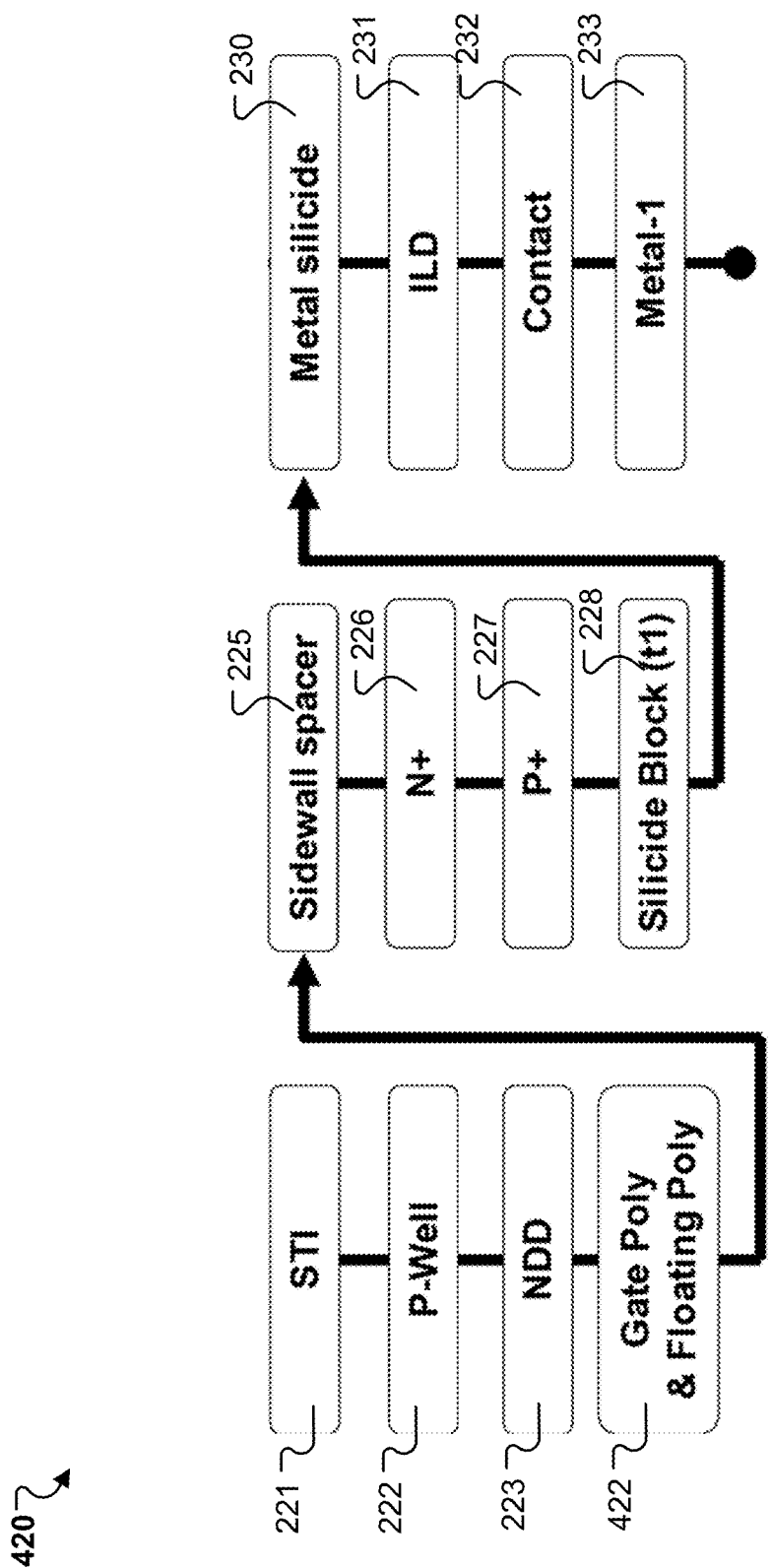

FIG. 4A-1 illustrates a cross-sectional view of a low-side switch LDMOS transistor device 400 with a second exemplary two-step field plate structure 410. Compared to the two-step field plate structure 210 in the transistor device 200 in FIG. 2A-1, the two-step field plate structure 410 includes a floating polysilicon layer 414 over a portion of the NDD region 106. The polysilicon layer 414 is separated from the NDD region 106 by a dielectric layer 416. The floating polysilicon 414 can have the same thickness and same material composition as the gate electrode 132 and can be formed together with the gate electrode 132 in the same process step. The dielectric layer 416 can have the same thickness and same material as the gate dielectric layer 134 and can be formed together with the gate dielectric layer 134 in the same process step. Sidewall spacers 418 are formed adjacent sidewalls of the floating polysilicon 414. The sidewall spacers 418 can be formed together with the sidewall spacers 136 adjacent sidewalls of the gate electrode 132 in the same process step. The sidewall spacer 418 can be over the drain region 107 and abut with the metal silicide on the drain region 107.

Unlike the transistor device 200 in FIG. 2A-1, where the first layer 212 extends under the second layer 214 in the field plate structure 210, in the implementation shown in FIG. 4A-1, the field plate structure 410 includes a first layer 412 that extends over the floating polysilicon layer 414. The first layer 412 extends laterally and conformally from over a portion of the gate electrode 132 and the drain-side sidewall spacer 136 of the gate electrode 132, to over the source-side sidewall spacer 418 of the floating polysilicon 414 and the floating polysilicon 414 itself. The metal field plate conformally overlies the first layer 412.

A first film region of the field plate structure 410 includes the first layer 412 and has a thickness of t1, and a second film region of the field plate structure 410 includes the dielectric layer 416, the floating polysilicon layer 412 and the first layer 412. The second film region has a thickness of t2. The first film region can have a length L1 with one end at a sidewall of the gate electrode 132 and the other end at a sidewall of the floating polysilicon layer 414. The second film region can have a length L2 defined by opposite sidewalls of the floating polysilicon layer 414. Accordingly, a first step field plate structure of the structure 410 includes the first film region and the metal field plate 216, and a second step field plate structure of the structure 410 includes the second film region and the metal field plate 216.

In a particular example, the transistor device 400 is configured for an operation voltage range of 6V to 60V. The first layer 412 includes a $SiO_2$ layer with a thickness of 600 Å to 2000 Å and a SiN layer with a thickness of 200 Å to 600 Å. The floating polysilicon layer 414 includes a polysilicon layer with a thickness of 1000 Å to 3000 Å. The first film region can have a length L1 of 0.2 µm to 3.0 µm, and the second film region can have a length L2 of 0.2 µm to 0.7 µm.

By electrically coupling the metal field plate 216 and the metal silicide 204 to the source region 105, the field plate 216 is biased by a source voltage, which can provide the high voltage transistor device 400 with a low on-state resistance and low dynamic power dissipation. The low dynamic power dissipation can provide the transistor device 400 for good performance during high frequency switching applications (e.g., above 10 MHz).

The transistor device 400 is configured to be a low-side switch LDMOS, where the source region 105 and the p-substrate 102 have the same operation range, e.g., a switch connected to ground in an inverter. The source region 105 can be floating such that the source voltage on the source region 105 can change during switching cycles.

FIG. 4A-2 is a flowchart showing salient steps of an exemplary fabrication process 420 for fabricating the transistor device 400 of FIG. 4A-1. Compared to the fabrication process 220 in FIG. 2A-2, the fabrication process 420 includes step 422 for forming the floating polysilicon layer 414 in the same step as the gate electrode 132 (e.g., gate polysilicon) and saves the step 239. The first layer 412 can be a silicide blocking layer formed in step 228.

Figures 1, 4B:
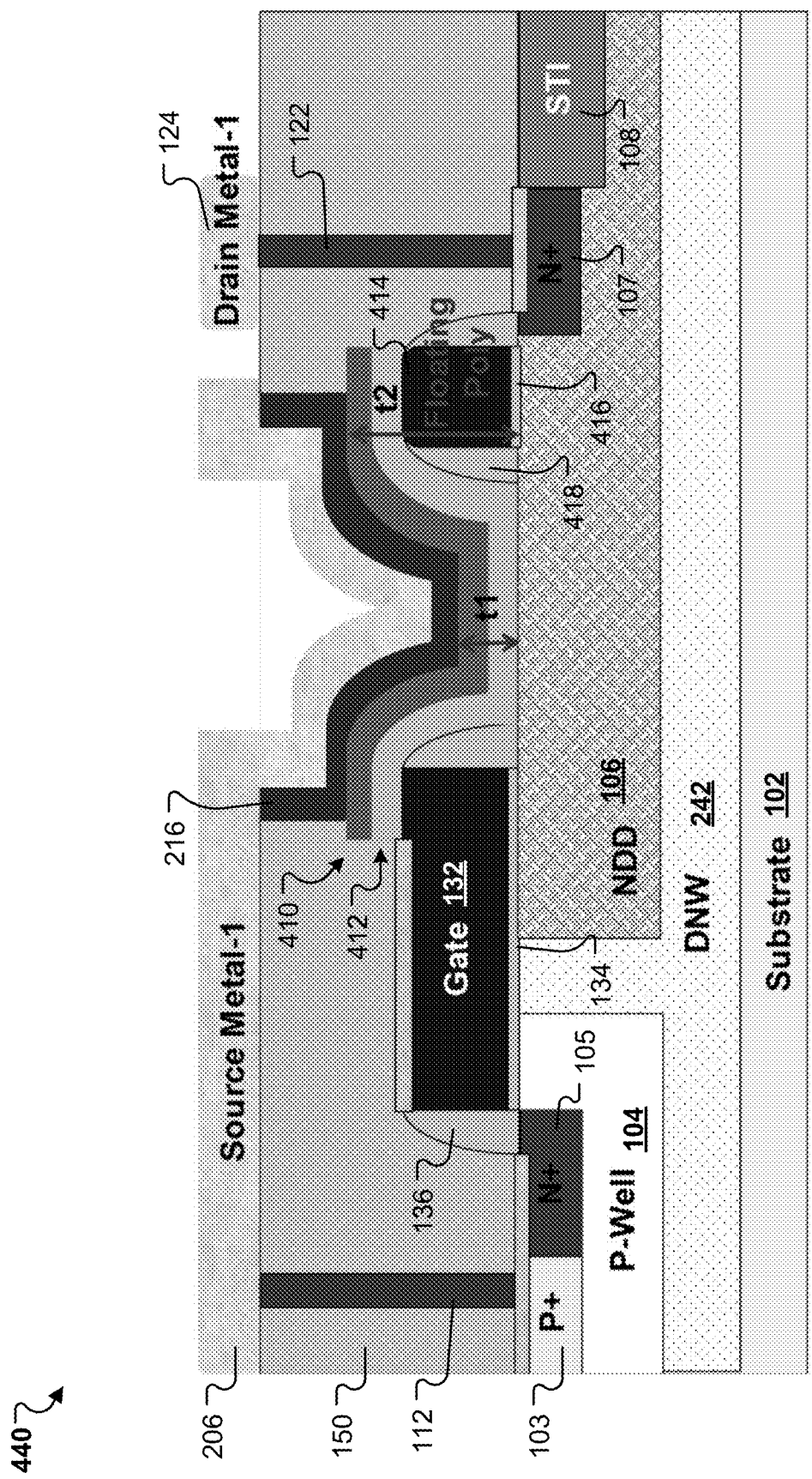
Figures 2, 4B:
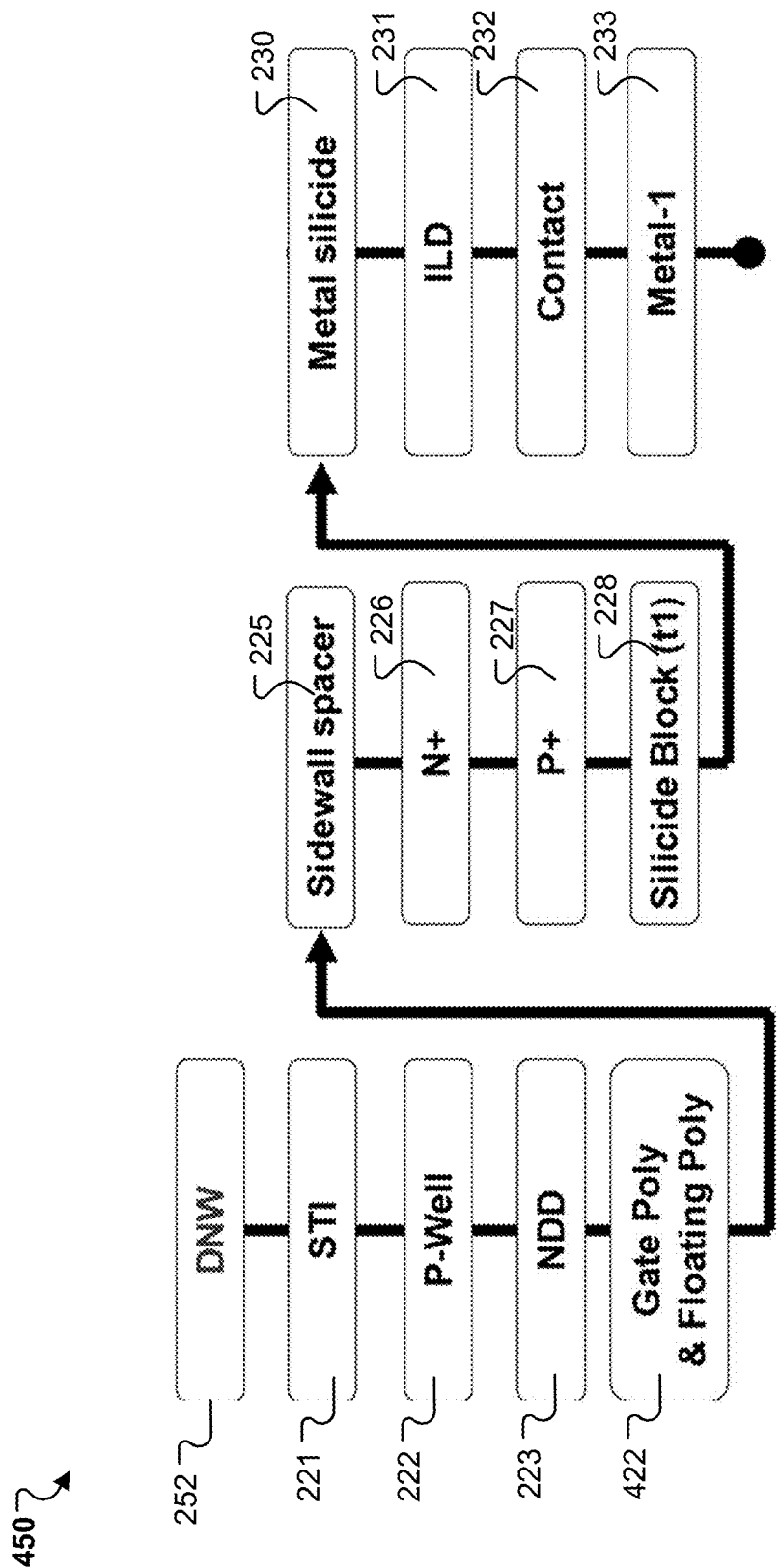

FIG. 4B-1 illustrates a cross-sectional view of an example high-side switch LDMOS transistor device 440 with the second exemplary field plate structure 410 of FIG. 4A-1. The transistor device 440 is similar to the transistor device 400 of FIG. 4A-1, except that the transistor device 440 is configured as a high-side switch LDMOS while the transistor device 400 is configured as a low-side switch LDMOS. As noted above in FIG. 2B-1, the transistor device 440 is similar to the transistor device 240 and can be configured to include a deep n-type well (DNW) 242 to prevent the source voltage from being raised over the substrate voltage by preventing charge carriers from traveling from the source region 105 to the substrate 102 (e.g., by way of punch through). The P-well 104 and the NDD region 106 are formed in the DNW 242. The DNW 242 can have a n-type doping concentration of $10^{15}$ $cm^{-3}$ to $10^{18}$ $cm^{-3}$.

FIG. 4B-2 is a flowchart showing salient steps of an exemplary fabrication process 450 for fabricating the transistor device 440 of FIG. 4B-1. Compared to the fabrication process 420 of FIG. 4A-2, the fabrication process 450 includes step 252 for forming the DNW 242 on the semiconductor substrate 102 before performing the fabrication process 420.

Figures 1, 4C:
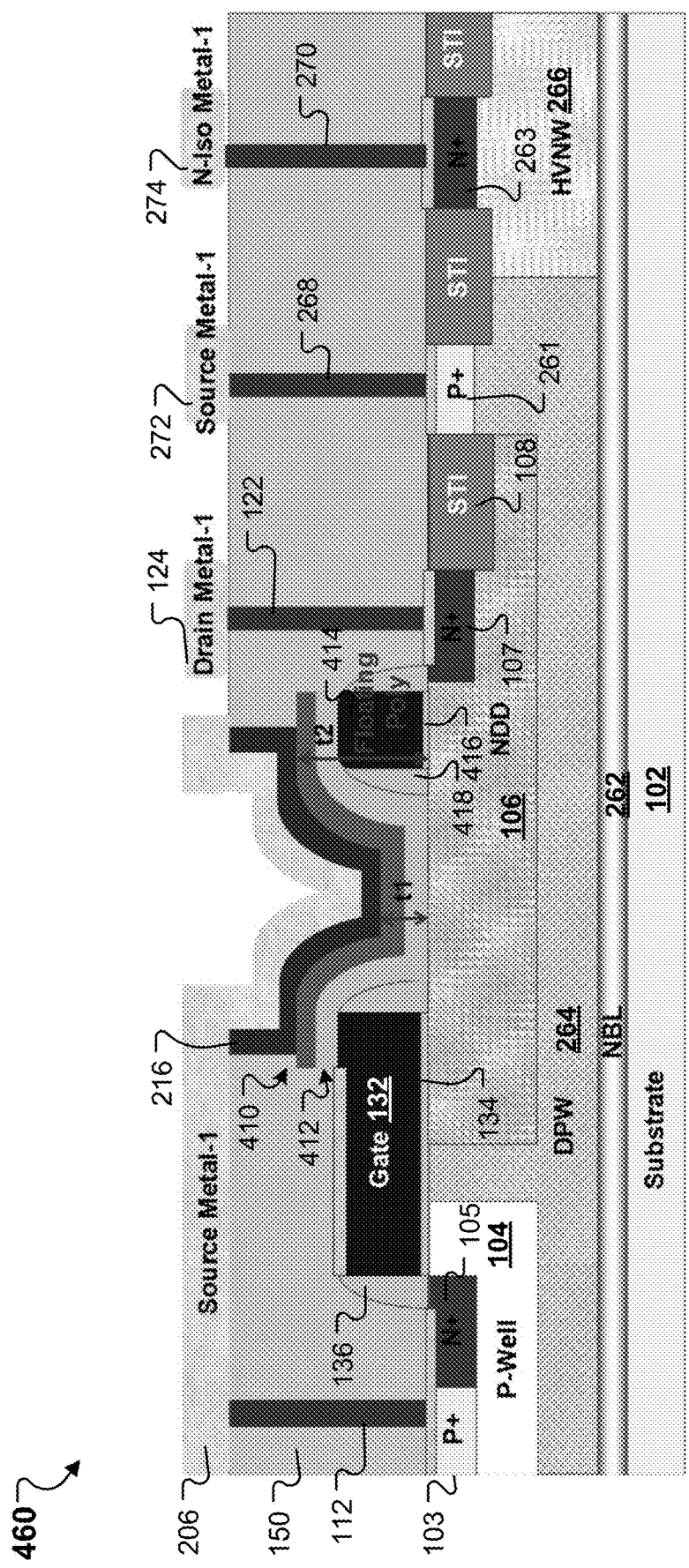
Figures 2, 4C:
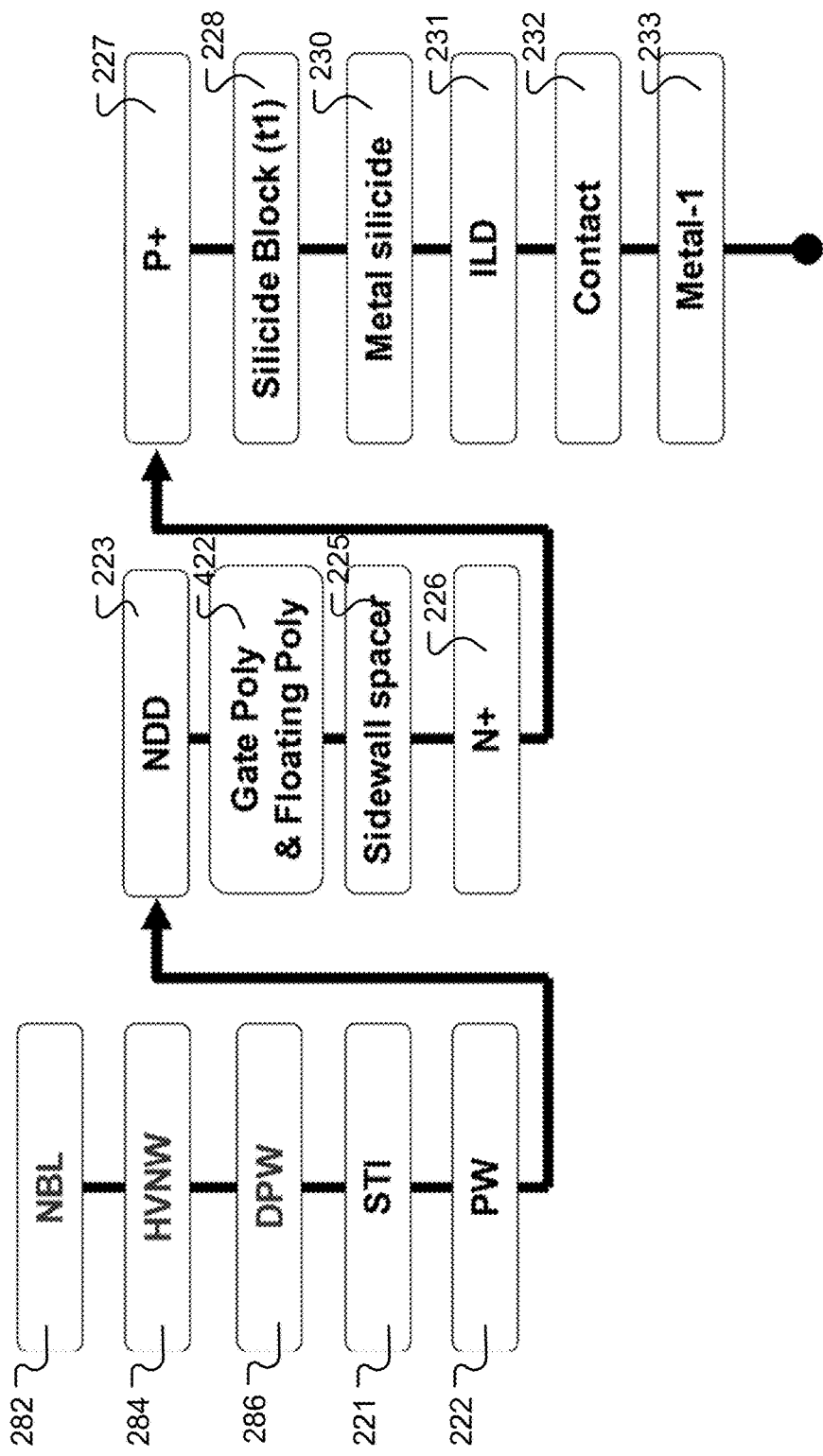

FIG. 4C-1 shows another high voltage transistor device 460 that is similar to the transistor device 200 of FIG. 2A-1,
except that the transistor device 460 is configured as a fully isolated switch LDMOS transistor device while the transistor device 400 is configured as a low-side switch LDMOS.

The transistor device 460 is similar to the transistor device 260 of FIG. 2C-1 and can be configured to include a deep p-type well (DPW) 264 and an underlying oppositely n-type doped buried layer (NBL) 262. The transistor device 460 further includes one or more additional STI regions 108 that laterally separate the drain region 107 from a p-type bulk region 261 and a buried layer 263 having n doping type. The bulk region 261 overlies the DPW 264 and the buried layer 263 overlies a high voltage n-type well (HVNW) region 266 that abuts the buried layer 253. Metal contacts 268 and 270 are configured to provide for biasing voltages to the bulk region 261 and the buried layer 263, respectively, so as to form junction isolation between the DPW 264 and the buried layer 263 and the HVNW region 266. A source metal line layer 272 and an N-ISO metal line layer 274 are selectively formed on the metal contacts 268 and 270. The source region 105 and the substrate 102 can have different input voltages, and the drain region 107 and the buried layer 263 can have different input voltages. Metal silicides can be also formed on the bulk region 261 and the buried layer 263.

FIG. 4C-2 is a flowchart showing salient steps of an exemplary fabrication process 480 for fabricating the transistor device 460 of FIG. 2C-1. Compared to the fabrication process 420 of FIG. 4A-2, the fabrication process 480 includes step 282 for forming the NBL 262 on the substrate 102, step 284 for forming the HVNW region 266 on the NBL 262, and step 286 for forming the DPW 264 on the NBL 262 before performing the fabrication process 420. When performing step 226, the buried layer 263 is also formed together with the N+ source region 105. When performing step 227, the bulk region 261 is also formed together with the P+ body contact region 103. When performing step 230, the metal silicides are also formed on the bulk region 261 and the buried layer 263.

Figure 5A:
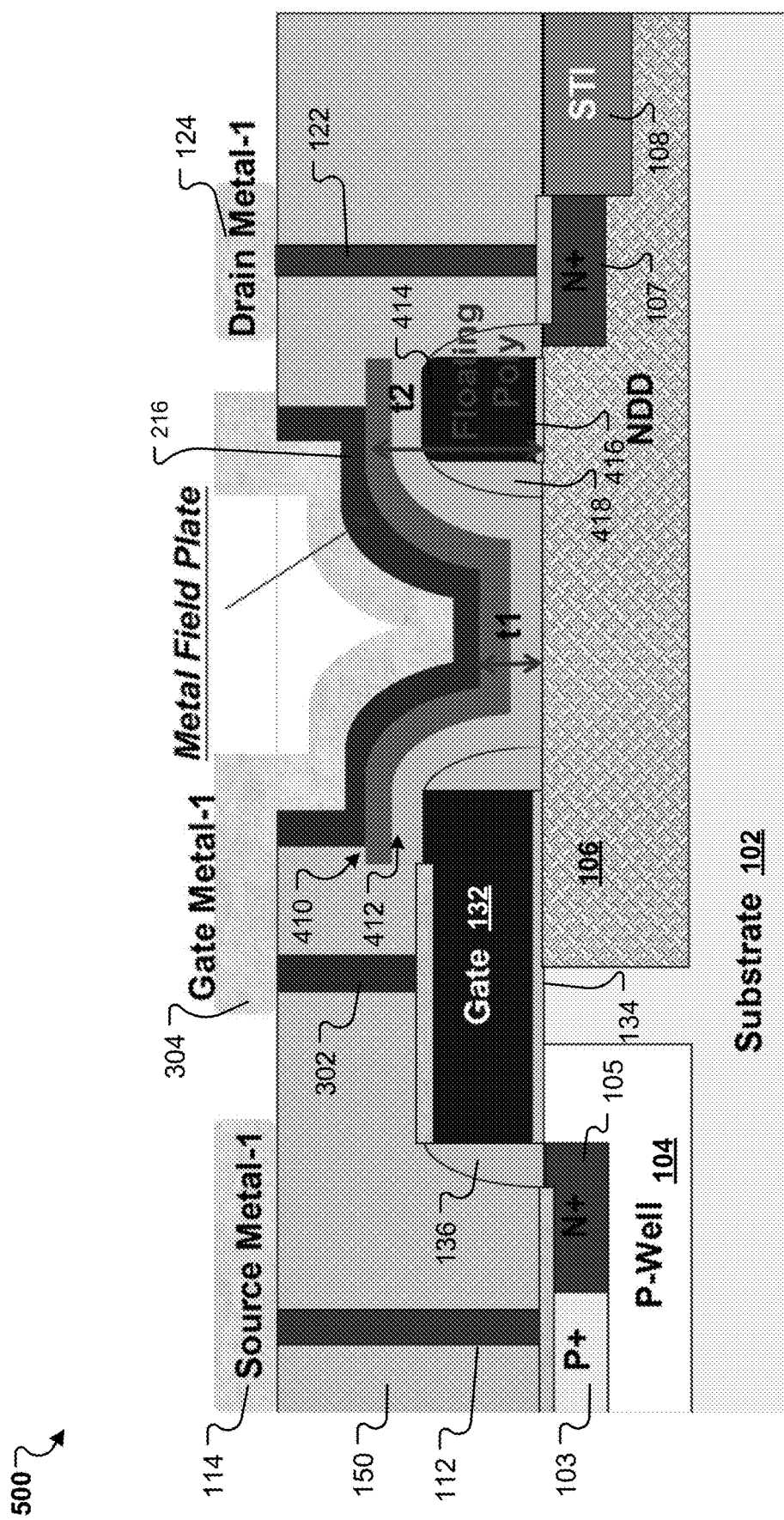
FIG. 5A illustrates a cross-sectional view of another low-side switch LDMOS transistor device with the second exemplary field plate structure of FIG. 4A-1, according to one or more implementations.

FIG. 5A illustrates a cross-sectional view of another low-side switch LDMOS transistor device 500 with the second exemplary field plate structure 410 of FIG. 4A-1. Compared to the transistor device 400 of FIG. 4A-1, the transistor device 500 has a different field plate biasing configuration. Instead of coupling the metal field plate 216 to the source region 105, the transistor device 500 is configured to couple the metal field plate 216 to the gate electrode 132 via a metal contact 302 within the ILD layer 150 and a gate metal line layer 304 overlying the ILD layer 150. The gate metal line layer 304 can conformally extend over the metal contact 302 to over the metal field plate 216.

By electrically coupling the metal field plate 216 to the gate electrode 132, the field plate 214 is biased by the gate voltage. Biasing the metal field plate 216 by the gate voltage provides the high voltage LDMOS device 500 with a low on-resistance vs. high breakdown voltage. The transistor device 500 having a gate bias field plate can be used in low frequency switching applications (e.g., below 10 MHz).

The transistor device 500 can be fabricated using the same process 420 for the transistor device 400. When performing step 232, the metal contact 302 is also formed together with other metal contacts 112 and 122. When performing step 233, the source metal layer 114 is formed over the metal contact 112 without connecting to the metal field plate 216, and the gate metal layer 304 is formed over the metal contact 302 and extends to overly the metal field plate 216.

Figure 5B:
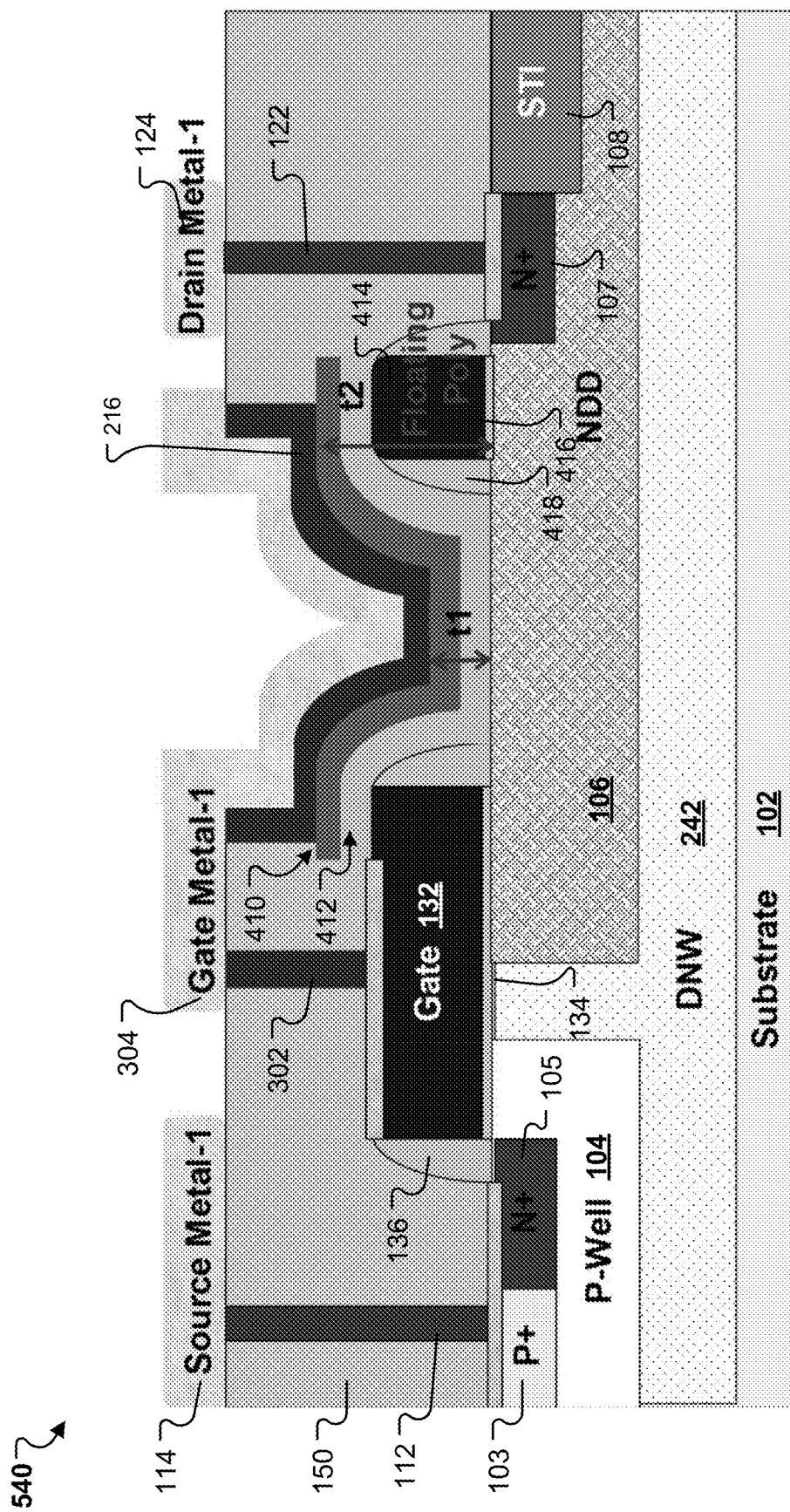
FIG. 5B illustrates a cross-sectional view of another high-side switch LDMOS transistor device with the second exemplary field plate structure of FIG. 4A-1, according to one or more implementations.

FIG. 5B illustrates a cross-sectional view of another high-side switch LDMOS transistor device 540 with the second exemplary field plate structure 410 of FIG. 4A-1.

Compared to the transistor device 440 of FIG. 4B-1, the transistor device 540 has a different field plate biasing configuration. Instead of coupling the metal field plate 216 to the source region 105, the transistor device 540 is configured to couple the metal field plate 216 to the gate electrode 132 via a metal contact 302 within the ILD layer 150 and a gate metal line layer 304 overlying the ILD layer 150. The gate metal line layer 304 can conformally extend over the metal contact 302 to over the metal field plate 216.

The transistor device 540 can be fabricated using the same process 450 for the transistor device 440. When performing step 232, the metal contact 302 is also formed together with other metal contacts 112 and 122. When performing step 233, the source metal layer 114 is formed over the metal contact 112 without connecting to the metal field plate 216, and the gate metal layer 304 is formed over the metal contact 302 and extends to overly the metal field plate 216.

Figure 5C:
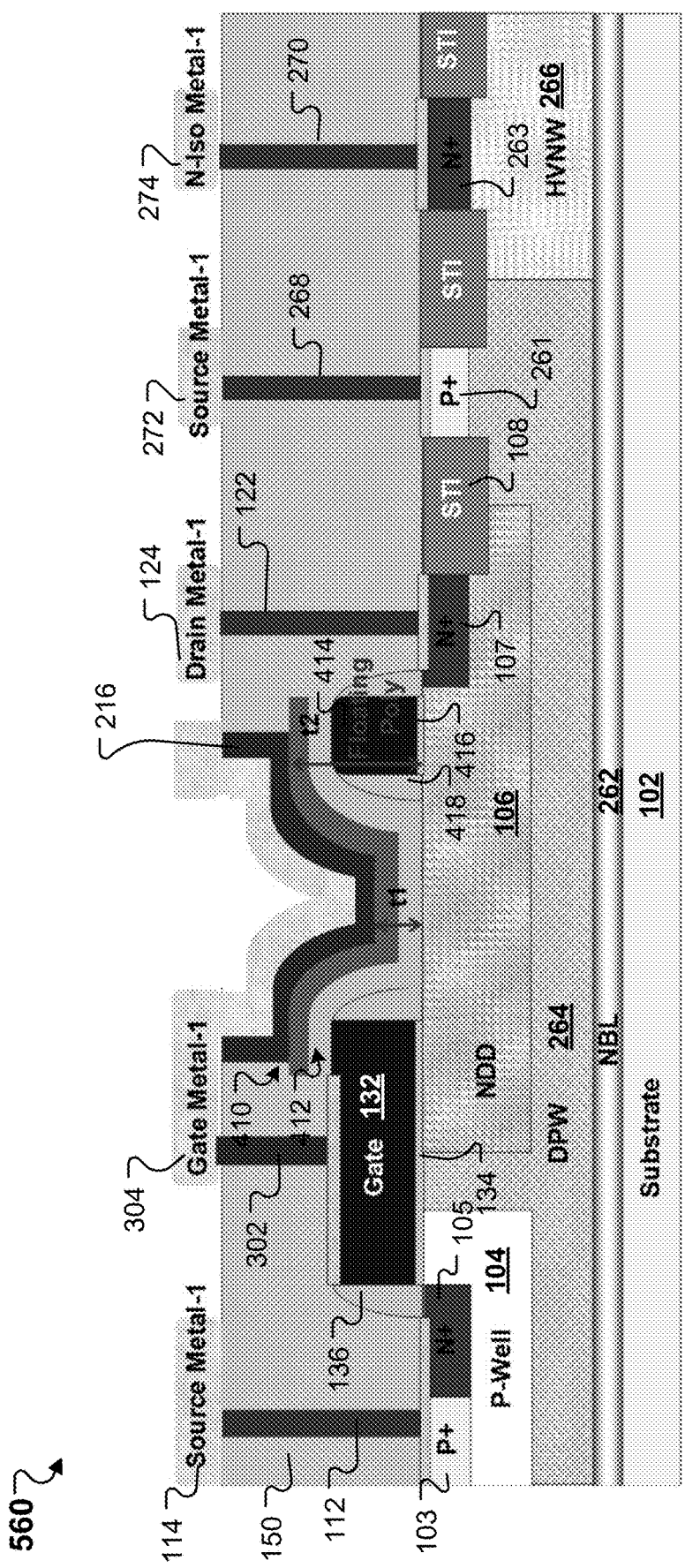
FIG. 5C illustrates a cross-sectional view of another fully isolated switch LDMOS transistor device with the second exemplary field plate structure of FIG. 4A-1, according to one or more implementations.

FIG. 5C illustrates a cross-sectional view of another fully isolated switch LDMOS transistor device 560 with the second exemplary field plate structure 410 of FIG. 4A-1. Compared to the transistor device 460 of FIG. 4C-1, the transistor device 560 has a different field plate biasing configuration. Instead of coupling the metal field plate 216 to the source region 105, the transistor device 560 is configured to couple the metal field plate 216 to the gate electrode 132 via a metal contact 302 within the ILD layer 150 and a gate metal line layer 304 overlying the ILD layer 150. The gate metal line layer 304 can conformally extend over the metal contact 302 to over the metal field plate 216.

The transistor device 560 can be fabricated using the same process 480 for the transistor device 460. When performing step 232, the metal contact 302 is also formed together with other metal contacts 112 and 122. When performing step 233, the source metal layer 114 is formed over the metal contact 112 without connecting to the metal field plate 216, and the gate metal layer 304 is formed over the metal contact 302 and extends to overly the metal field plate 216.

Figures 1, 6A:
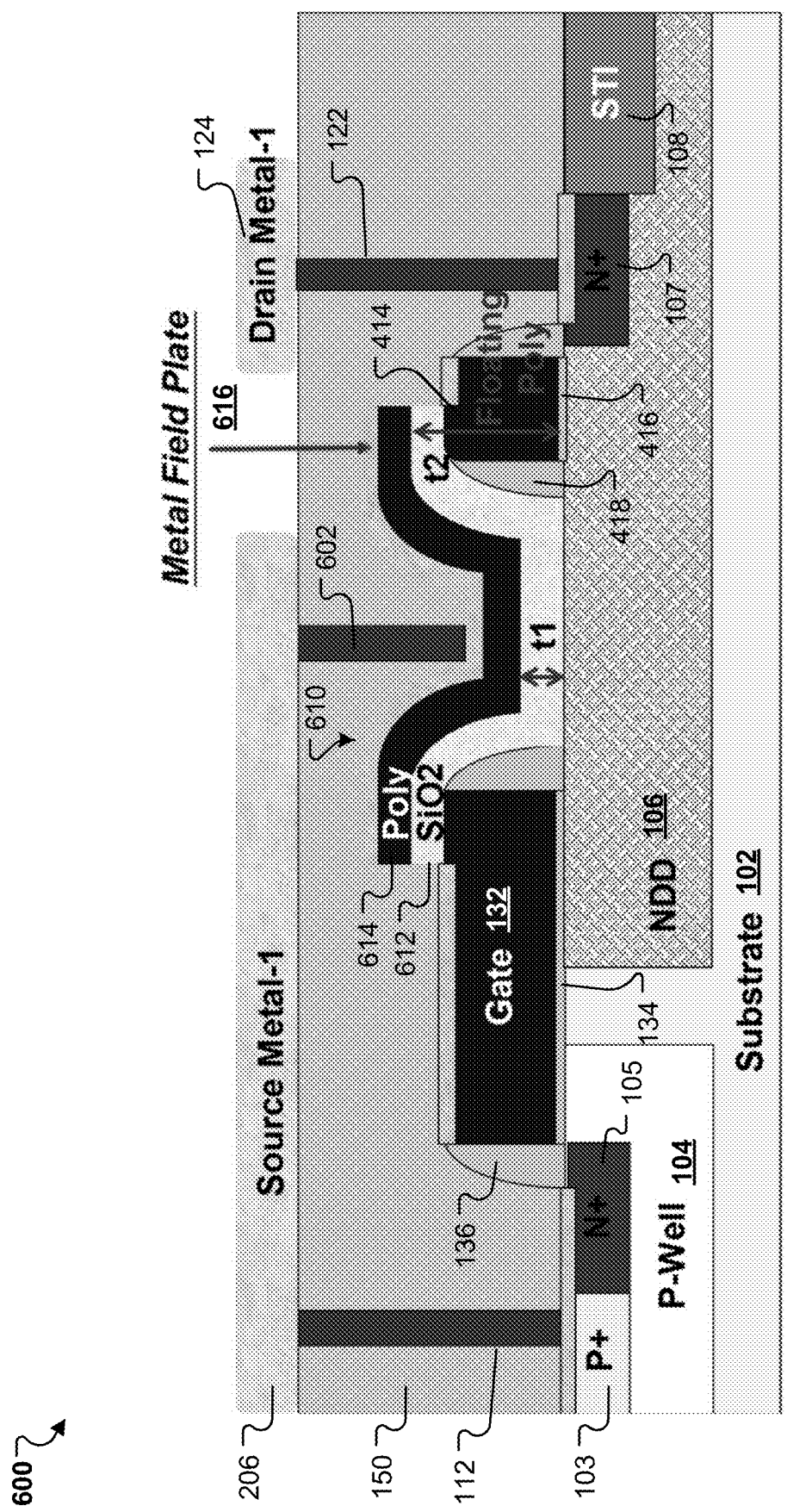
Figures 2, 6A:
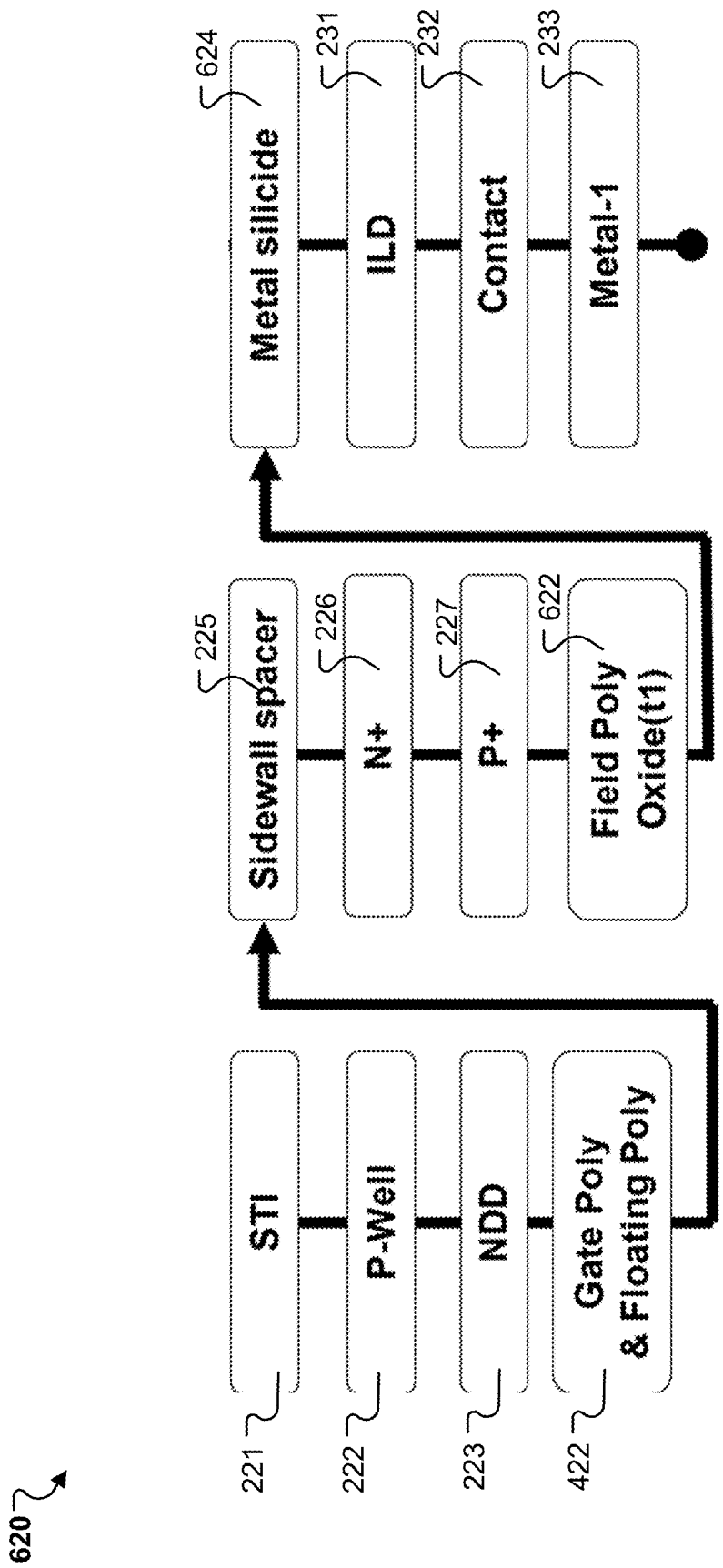

FIG. 6A-1 illustrates a cross-sectional view of a low-side switch LDMOS transistor device 600 with a third exemplary two-step field plate structure 610. Similar to the two-step field plate structure 410 in the transistor device 400 in FIG. 4A-1, the two-step field plate structure 610 includes a floating polysilicon layer 414 over a portion of the NDD region 106 via a dielectric layer 416. The floating polysilicon 414 can have the same thickness and same material as the gate electrode 132 and can be formed together with the gate electrode 132 in the same process step. The dielectric layer 416 can have the same thickness and same material as the gate dielectric layer 134 and can be formed together with the gate dielectric layer 134 in the same process step. Sidewall spacers 418 are formed adjacent sidewalls of the floating polysilicon 414. The sidewall spacers 418 can be formed together with the sidewall spacers 136 adjacent sidewalls of the gate electrode 132 in the same process step. The sidewall spacer 418 can be over the drain region 107 and abut with the metal silicide on the drain region 107.

However, unlike the first layer 412 which includes two dielectric layers, e.g., a $SiO_2$/SiN bilayer, in the field plate structure 410, the field plate structure 610 includes a first layer 612 including a single dielectric layer of a one composition, e.g., $SiO_2$. Moreover, whereas the first layer 412 extends laterally and conformally a total length of the floating polysilicon layer 414, in the implementation of FIG. 6A-1, the first layer 612 only covers a portion of the floating polysilicon layer 414. The other portion of the floating polysilicon layer 414 that is adjacent to the drain region 107 is covered by metal silicide.

The field plate structure 610 includes a metal silicide layer as a metal field plate 616 over the first layer 612 with a polysilicon layer 614 therebetween. The metal field plate 616 can be formed together with the metal silicide layer on the other portion of the floating polysilicon layer 414 on the same process step during fabrication. Moreover, the metal field plate 616 can be formed together with other metal silicide layers on the source region 105, the gate electrode 132, and the drain region 107 in the same process step during the fabrication. A metal contact 602 is formed in the ILD layer 150 and coupled to the metal field plate 616. For biasing the field plate 616 by the source voltage, the metal contact 602 is coupled to the source metal line layer 206.

A first film region of the field plate structure 610 includes the first layer 612 and has a thickness of t1, and a second film region of the field plate structure 610 includes the dielectric layer 416, the floating polysilicon layer 412 and the first layer 612. The second film region has a thickness of t2. The first film region can have a length L1 with one end at a sidewall of the gate electrode 132 and the other end at a sidewall of the floating polysilicon layer 414. The second film region can have a length L2 defined by opposite sidewalls of the floating polysilicon layer 414. Accordingly, a first step field plate structure of the structure 610 includes the first film region, the polysilicon layer 614, and the metal field plate 616, and a second step field plate structure of the structure 610 includes the second film region, the polysilicon layer 614, and the metal field plate 616.

In a particular example, the transistor device 600 is configured for an operation voltage range of 6V to 60V. The first layer 612 includes a $SiO_2$ layer with a thickness of 600 Å to 2500 Å. The floating polysilicon layer 414 includes a polysilicon layer with a thickness of 1000 Å to 3000 Å. The first film region can have a length L1 of 0.2 μm to 3.0 μm, and the second film region can have a length L2 of 0.2 μm to 0.7 μm.

By electrically coupling the metal field plate 616 to the source region 105, the field plate 216 is biased by a source voltage, which can provide the high voltage transistor device 600 with a low on-state resistance and low dynamic power dissipation. The low dynamic power dissipation can provide the transistor device 600 for good performance during high frequency switching applications (e.g., above 10 MHz).

The transistor device 600 is configured to be a low-side switch LDMOS, where the source region 105 and the p-substrate 102 have the same operation range, e.g., a switch connected to ground in an inverter. The source region 105 can be floating such that the source voltage on the source region 105 can change during switching cycles.

FIG. 6A-2 is a flowchart showing salient steps of an exemplary fabrication process 620 for fabricating the transistor device 600 of FIG. 6A-1. Compared to the fabrication process 420 in FIG. 4A-2, the fabrication process 620 includes step 622 for forming the first layer 612 as a field polysilicon oxide layer and step 624 for forming the metal silicide layer as the metal field plate 616.

Figures 1, 6B:
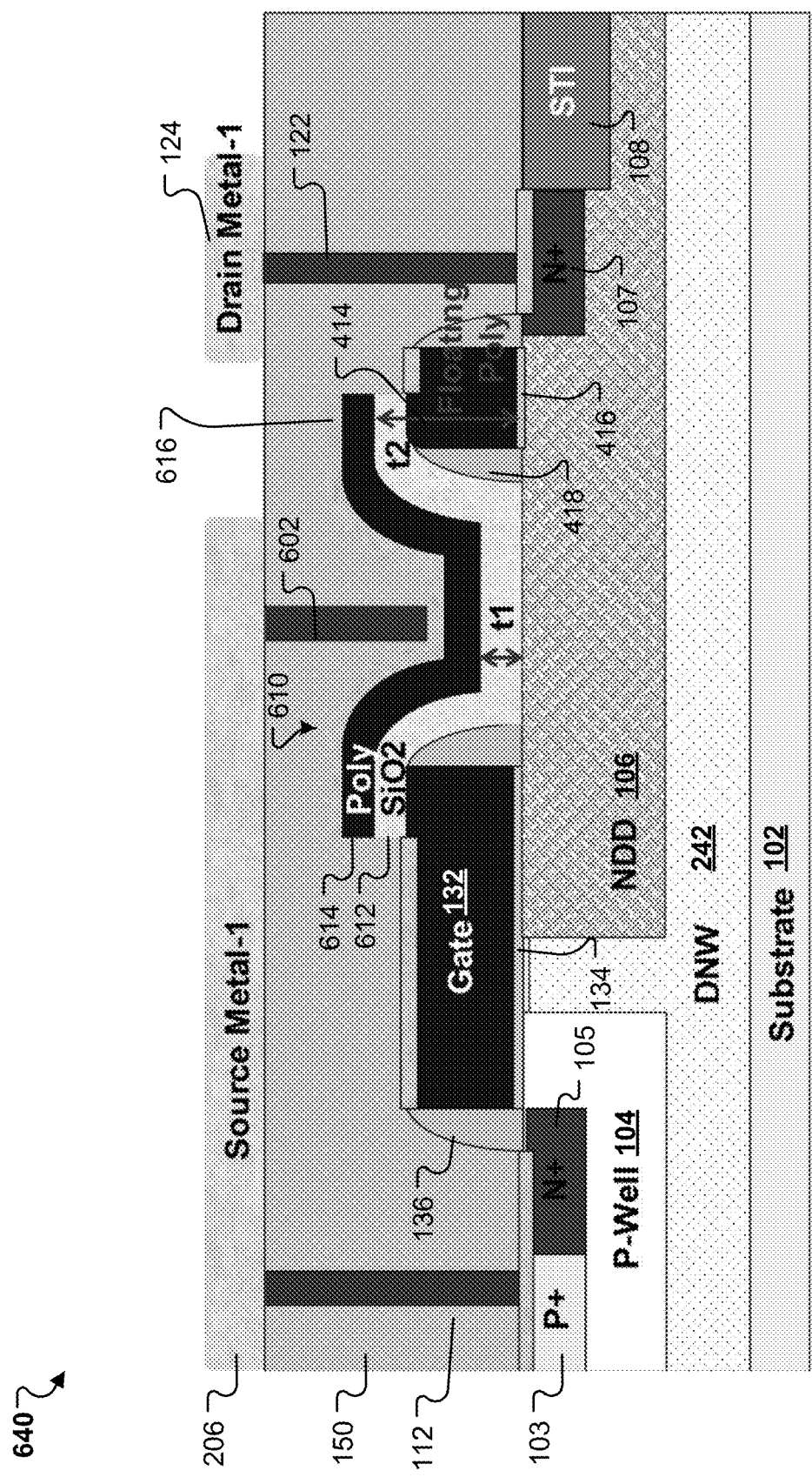
Figures 2, 6B:
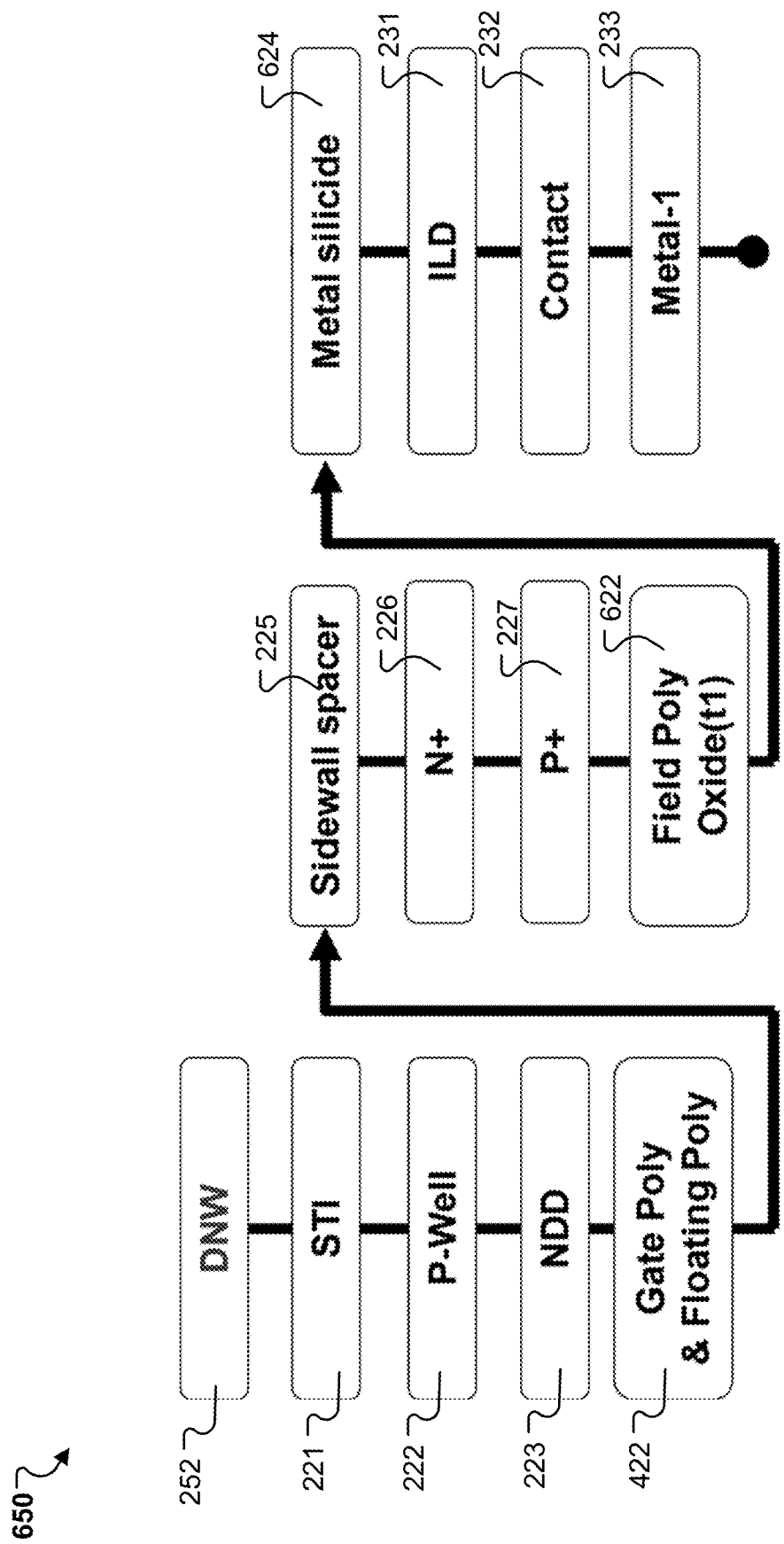

FIG. 6B-1 illustrates a cross-sectional view of an example high-side switch LDMOS transistor device 640 with the third exemplary field plate structure 610 of FIG. 6A-1. The transistor device 640 is similar to the transistor device 600 of FIG. 6A-1, except that the transistor device 640 is configured as a high-side switch LDMOS while the transistor device 600 is configured as a low-side switch LDMOS. As noted above, the transistor device 640 is similar to the transistor device 440 and can be configured to include a deep n-type well (DNW) 242 to prevent the source voltage from being raised over the substrate voltage by preventing charge carriers from traveling from the source region 105 to the substrate 102 (e.g., by way of punch through). The P-well 104 and the NDD region 106 are formed in the DNW 242. The DNW 242 can have a n-type doping concentration of $10^{15}$ cm$^{-3}$ to $10^{18}$ cm$^{-3}$.

FIG. 6B-2 is a flowchart showing salient steps of an exemplary fabrication process 650 for fabricating the transistor device 640 of FIG. 6B-1. Compared to the fabrication process 620 of FIG. 6A-2, the fabrication process 650 includes step 252 for forming the DNW 242 on the semiconductor substrate 102 before performing the fabrication process 620.

Figures 1, 6C:
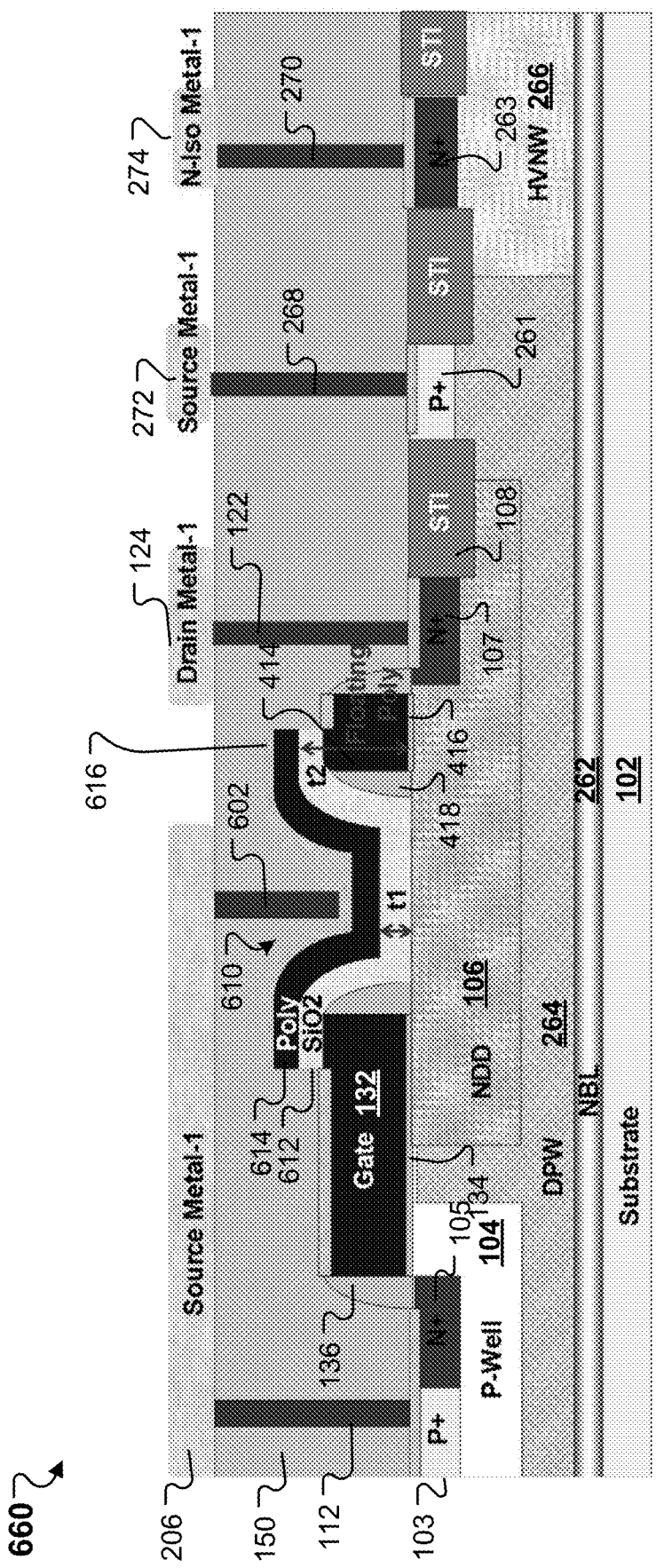
Figures 2, 6C:
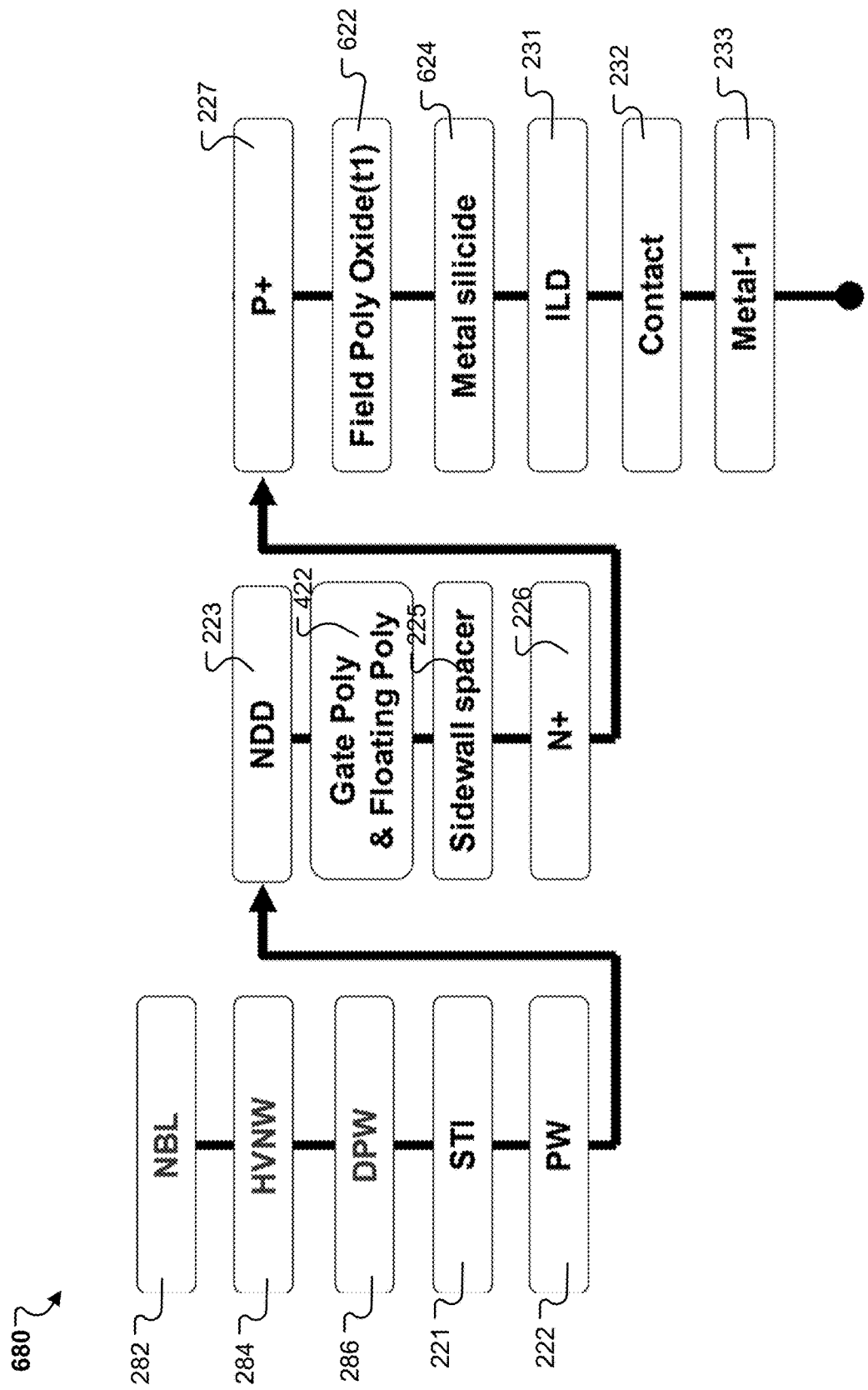

FIG. 6C-1 shows another high voltage transistor device 660 that is similar to the transistor device 600 of FIG. 6A-1, except that the transistor device 660 is configured as a fully isolated switch LDMOS transistor device while the transistor device 600 is configured as a low-side switch LDMOS.

The transistor device 660 is similar to the transistor device 260 of FIG. 2C-1 and can be configured to include a deep p-type well (DPW) 264 and an underlying oppositely n-type doped buried layer (NBL) 262. The transistor device 660 further includes one or more additional STI regions 108 that laterally separate the drain region 107 from a p-type bulk region 261 and a buried layer 263 having n doping type. The bulk region 261 overlies the DPW 264 and the buried layer 263 overlies a high voltage n-type well (HVNW) region 266 that abuts the buried layer 253. Metal contacts 268 and 270 are configured to provide for biasing voltages to the bulk region 261 and the buried layer 263, respectively, so as to form junction isolation between the DPW 264 and the buried layer 263 and the HVNW region 266. A source metal line layer 272 and an N-ISO metal line layer 274 are selectively formed on the metal contacts 268 and 270. The source region 105 and the substrate 102 can have different input voltages, and the drain region 107 and the buried layer 263 can have different input voltages. Metal silicides can be also formed on the bulk region 261 and the buried layer 263.

FIG. 6C-2 is a flowchart showing salient steps of an exemplary fabrication process 680 for fabricating the transistor device 660 of FIG. 6C-1. Compared to the fabrication process 620 of FIG. 6A-2, the fabrication process 680 includes step 282 for forming the NBL 262 on the substrate 102, step 284 for forming the HVNW region 266 on the NBL 262, and step 286 for forming the DPW 264 on the NBL 262 before performing the fabrication process 420. When performing step 226, the buried layer 263 is also formed together with the N+ source region 105. When performing step 227, the bulk region 261 is also formed together with the P+ body contact region 103. When performing step 624, the metal silicides are also formed on the bulk region 261 and the buried layer 263.

Figure 7A:
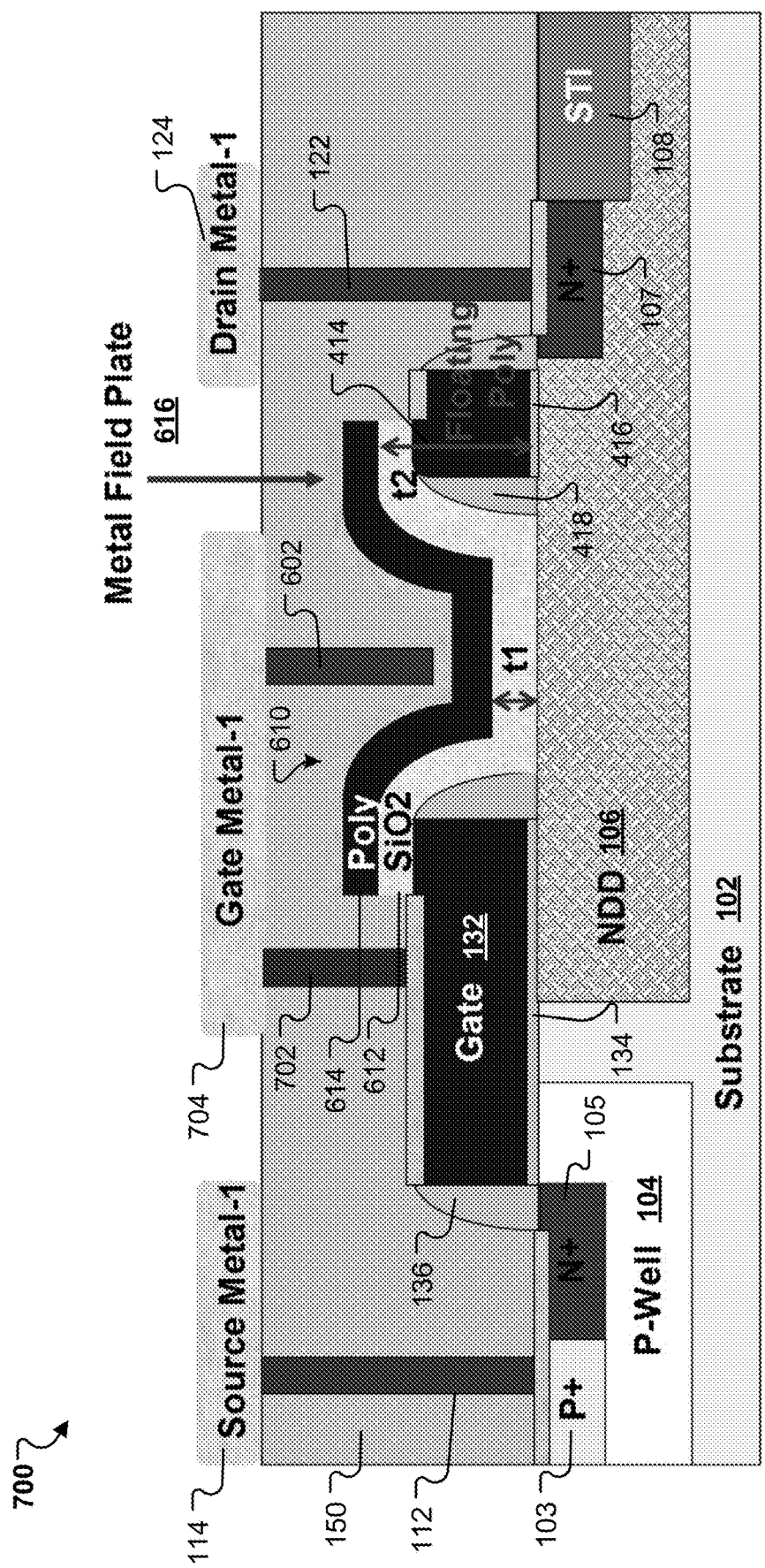
FIG. 7A illustrates a cross-sectional view of another low-side switch LDMOS transistor device with the third exemplary field plate structure of FIG. 6A-1, according to one or more implementations.

FIG. 7A illustrates a cross-sectional view of another low-side switch LDMOS transistor device 700 with the third exemplary field plate structure 610 of FIG. 6A-1. Compared to the transistor device 600 of FIG. 6A-1, the transistor device 700 has a different field plate biasing configuration. Instead of coupling the metal field plate 616 to the source region 105, the transistor device 700 is configured to couple the metal field plate 616 to the gate electrode 132 via the metal contact 602 and via a metal contact 702 within the ILD layer 150 and a gate metal line layer 704 overlying the ILD layer 150 and coupled to the metal contact 602 and the metal contact 702. The metal contact 702 is vertically coupled to the gate electrode 132 and the gate metal line layer 705.

By electrically coupling the metal field plate 616 to the gate electrode 132, the field plate 616 is biased by the gate voltage. Biasing the metal field plate 616 by the gate voltage provides the high voltage LDMOS device 700 with a low on-resistance vs. high breakdown voltage. The transistor device 700 having a gate bias field plate can be used in low frequency switching applications (e.g., below 10 MHz).

The transistor device 700 can be fabricated using the same process 620 for the transistor device 600. When performing step 232, the metal contacts 602 and 702 are also formed together with other metal contacts 112 and 122. When performing step 633, the source metal layer 114 is formed over the metal contact 112 without connecting to the metal field plate 216, and the gate metal line layer 704 is formed over the metal contacts 602 and 702.

Figure 7B:
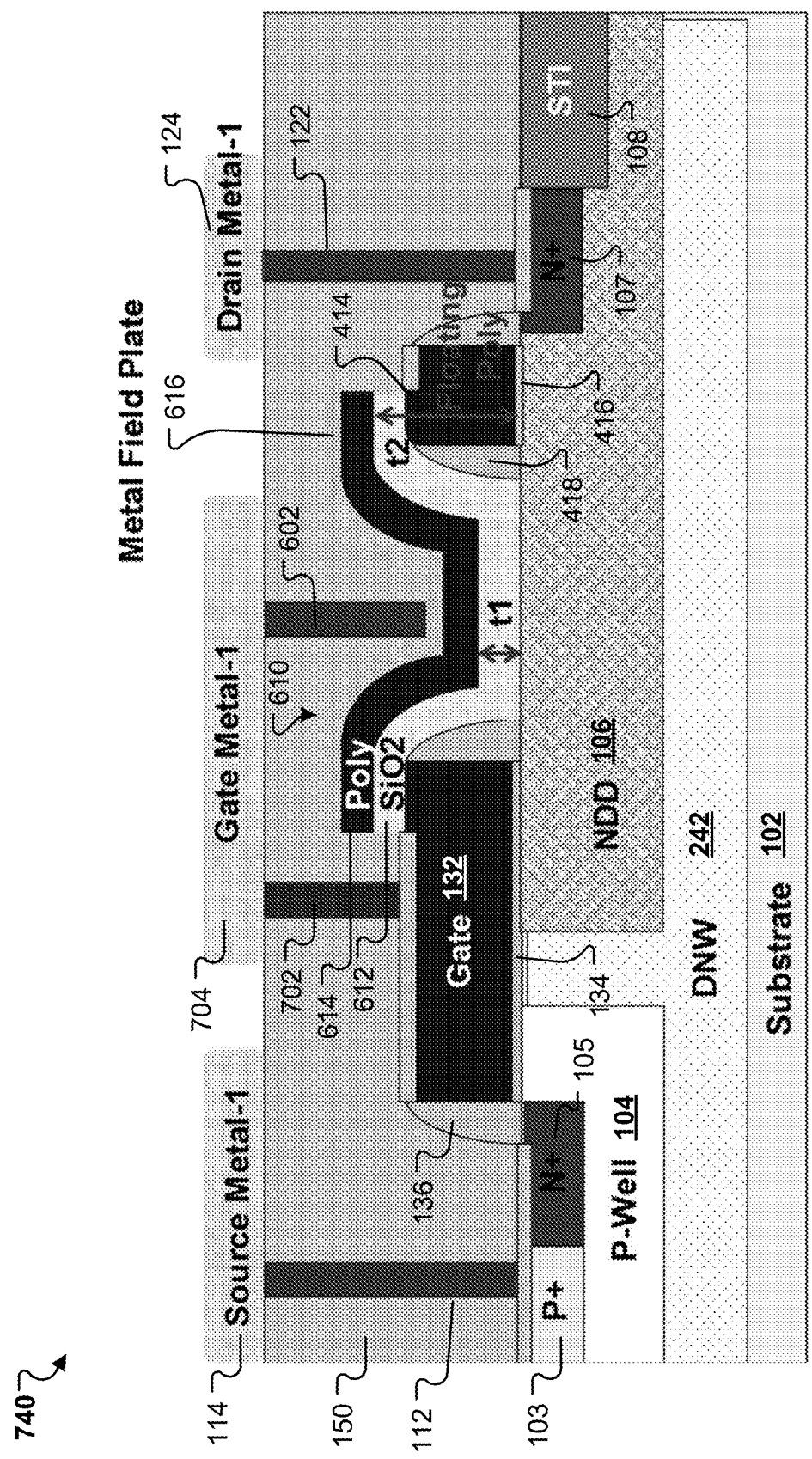
FIG. 7B illustrates a cross-sectional view of another high-side switch LDMOS transistor device with the third exemplary field plate structure of FIG. 6A-1, according to one or more implementations.

FIG. 7B illustrates a cross-sectional view of another high-side switch LDMOS transistor device 740 with the third exemplary field plate structure 610 of FIG. 6A-1. Compared to the transistor device 640 of FIG. 6B-1, the transistor device 740 has a different field plate biasing configuration. Instead of coupling the metal field plate 616 to the source region 105, the transistor device 740 is configured to couple the metal field plate 616 to the gate electrode 132 via metal contacts 602 and 702 within the ILD layer 150 and a gate metal line layer 704 overlying metal contact 602 and 702.

The transistor device 740 can be fabricated using the same process 650 for the transistor device 640. When performing step 232, the metal contacts 602 and 702 are also formed together with other metal contacts 112 and 122. When performing step 633, the source metal layer 114 is formed over the metal contact 112 without connecting to the metal field plate 216, and the gate metal line layer 704 is formed over the metal contacts 602 and 702.

Figure 7C:
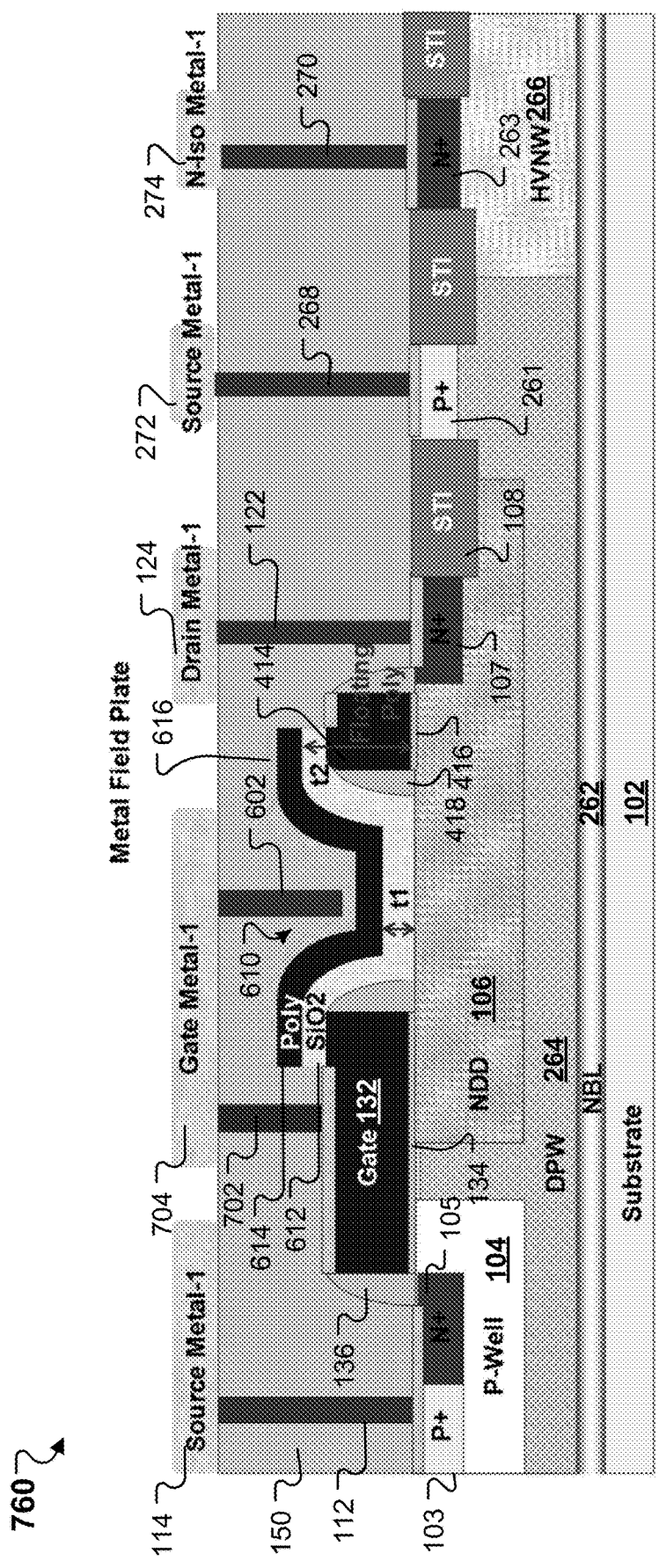
FIG. 7C illustrates a cross-sectional view of another fully isolated switch LDOS transistor device with the third exemplary field plate structure of FIG. 6A-1, according to one or more implementations.

FIG. 7C illustrates a cross-sectional view of another fully isolated switch LDMOS transistor device 760 with the third exemplary field plate structure 610 of FIG. 6A-1. Compared to the transistor device 660 of FIG. 6C-1, the transistor device 760 has a different field plate biasing configuration. Instead of coupling the metal field plate 616 to the source region 105, the transistor device 660 is configured to couple the metal field plate 616 to the gate electrode 132 via metal contacts 602 and 702 within the ILD layer 150 and a gate metal line layer 704 overlying the ILD layer 150. The gate metal line layer 704 extends laterally over the metal contacts 602 and 702.

The transistor device 760 can be fabricated using the same process 680 for the transistor device 660. When performing step 232, the metal contacts 602 and 702 are also formed together with other metal contacts 112 and 122. When performing step 633, the source metal layer 114 is formed over the metal contact 112 without connecting to the metal field plate 216, and the gate metal line layer 704 is formed over the metal contacts 602 and 702.

Exemplary Processes

Figure 8:
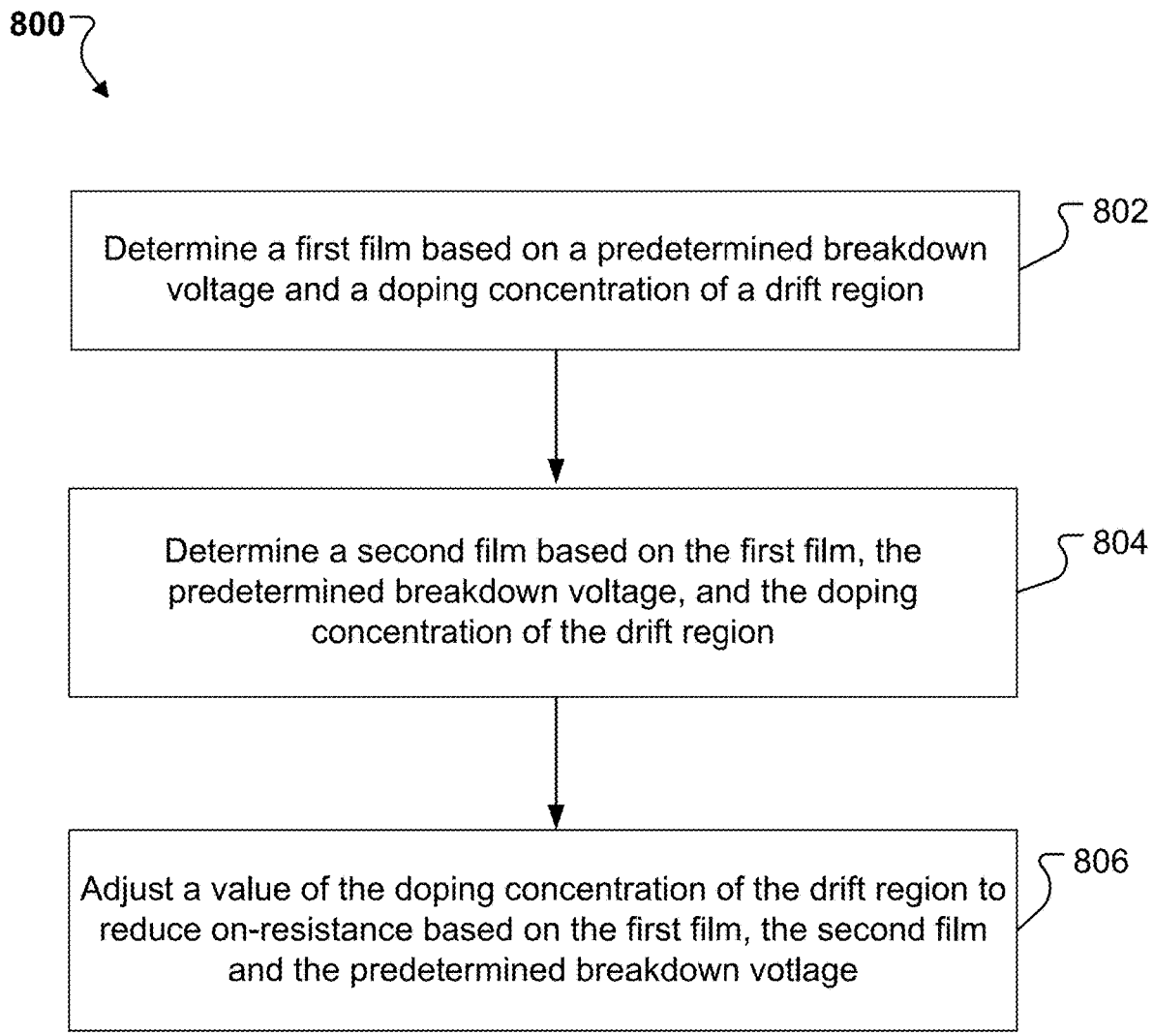
FIG. 8 shows an example process of configuring a high-voltage transistor device with a two-step field plate structure, according to one or more implementations.

FIG. 8 shows an example process 800 of configuring a high-voltage transistor device with a two-step field plate structure, according to one or more implementations. The transistor device can be one of the transistor devices as described above, and the two-step field plate structure can be the two-step field plate structure 210, 410, or 610. The process 800 can be performed by simulation, e.g., using a simulation software such as Silvaco TCAD, or experimental tests, or a combination thereof.

A first film is determined based on a predetermined breakdown voltage and a doping concentration of a drift region (802). The transistor device can be designed to have a predetermined operation voltage, e.g., within a range of 6

V to 40 V. The breakdown voltage of the transistor device can be determined based on a maximum value of the operation voltage. For example, the breakdown voltage can be 1.2 times of the maximum operation voltage, e.g., 48V. The first film can include one or more dielectric layers. In some examples, the first film includes a $SiO_2$ layer. In some examples, the first film includes a silicide blocking layer such as SiN layer. In some examples, the first film includes multiple layers such as $SiO_2$/SiN layers. As discussed above, the first film can extend laterally from over a gate electrode to over the drift region, or even to a drain region. Properties of the first film, e.g., thickness, length and material, can be determined to get a breakdown voltage close to the predetermined breakdown voltage. A value of the doping concentration of the drift region can be initially set to be low, e.g., $2 \times 10^{16}$ $cm^{-3}$.

A second film is determined based on the first film, the predetermined breakdown voltage, and the doping concentration of the drift region (804). The second film can be disposed over the first film, e.g., in the field plate structure 210, or under the first film, e.g., in the field plate structure 410 or 610. An electric field on a metal field plate over the first film and the second film can be simulated. Properties of the second film, e.g., thickness, length, and material, can be determined by getting a uniform electric field across the metal field plate and getting a breakdown voltage no less than the predetermined breakdown voltage. In some examples, the properties of the first film and the properties of the second film can be adjusted accordingly to obtain a breakdown voltage higher than the predetermined breakdown voltage. Adding the second film can increase the breakdown voltage of the transistor device, which also adds more parameters for adjusting the breakdown voltage.

The value of the doping concentration of the drift region is adjusted to reduce an on-resistance of the transistor device based on the first film, the second film, and the predetermined breakdown voltage (806). The value of the doping concentration of the drift region can be adjusted to a higher value to reduce the on-resistance. As the breakdown voltage is also reduced with a higher value of the doping concentration of the drift region, the breakdown voltage of the transistor device is monitored and is maintained to be higher than the predetermined breakdown voltage, e.g., by adjusting the properties of the second film and optionally the first film. In such a way, the on-resistance and the breakdown voltage can be optimized by adjusting the value of the doping concentration of the drift region and the properties of the second film and optionally the first film.

In a particular example, the transistor device is designed to be operated at a maximum voltage 40 V, and the breakdown voltage is predetermined to be 48 V. An initial condition includes the doping concentration of the drift region is $2 \times 10^{16}$ $cm^{-3}$ and the field plate structure includes the first film without the second film. Under the initial condition, the obtained breakdown voltage is 40 V, which is lower than the predetermined breakdown voltage. When the second film is added in the field plate structure, the obtained breakdown voltage is 60 V, which is higher than the predetermined breakdown voltage. This also indicates that adding the second film can increase the breakdown voltage. Then, when the doping concentration of the drift region increases from $2 \times 10^{16}$ $cm^{-3}$ to $3 \times 10^{16}$ $cm^{-3}$ and the field plate structure still includes the second film, the on-resistance of the transistor device is reduced, and the obtained breakdown voltage becomes 50 V, which is still higher than the predetermined breakdown voltage.

Figure 9:
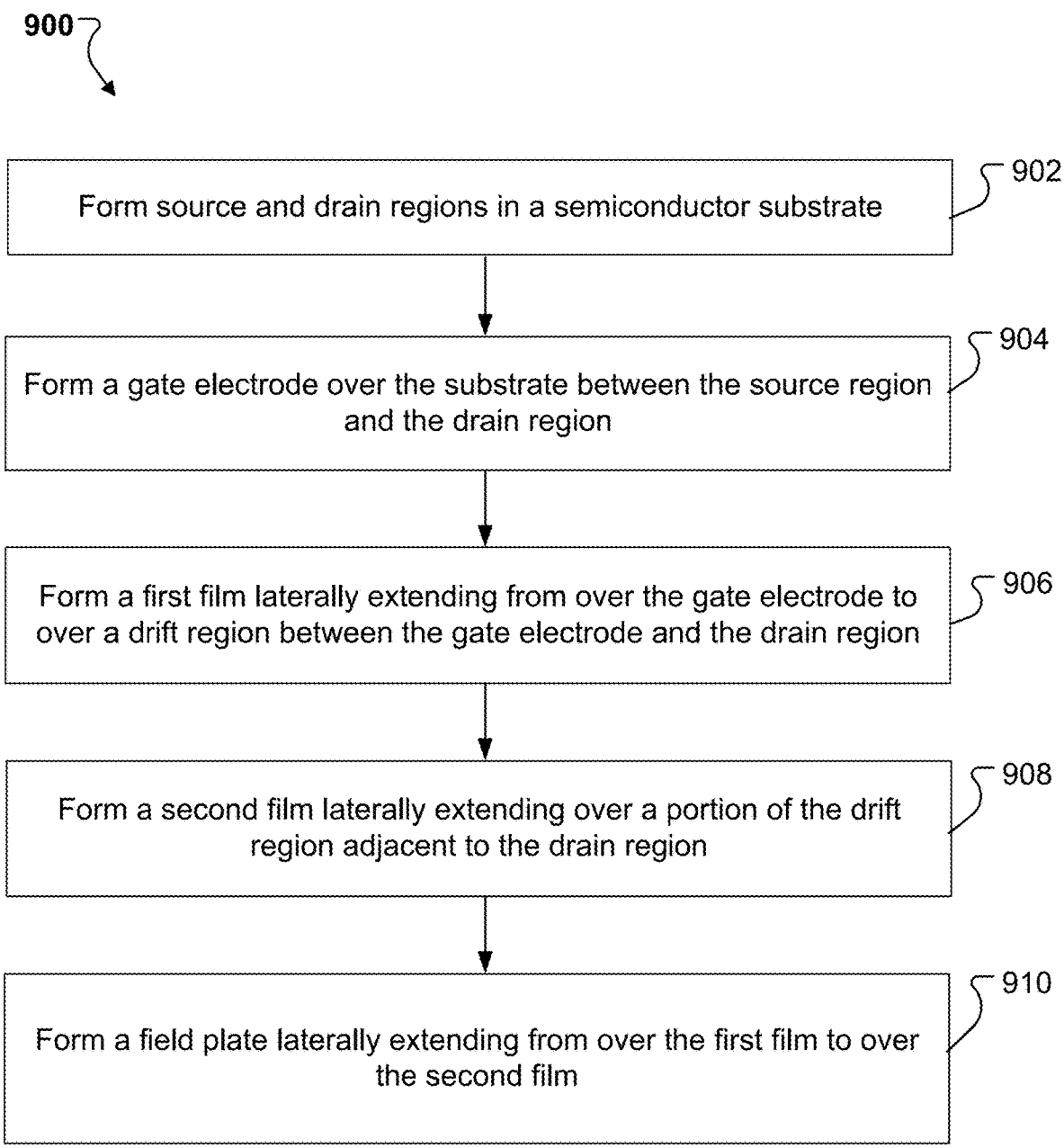
FIG. 9 shows an example process of fabricating a high-voltage transistor device with a two-step field plate structure, according to one or more implementations.

FIG. 9 shows an example process 900 of fabricating a high-voltage transistor device with a two-step field plate structure, according to one or more implementations. The transistor device can be one of the transistor devices as described above, and the two-step field plate structure can be the two-step field plate structure 210, 410, or 610. The process 900 can form the transistor device using standard processes, for example, triple well process, BCD process, non-EPI process with triple well process or twin well process, and/or single poly or double poly process.

Source and drain regions are formed in a semiconductor substrate (902). The semiconductor substrate can have a first dopant type, e.g., p-type. A well of the first dopant type, e.g., p type, can be first formed in the substrate. A doping drift region of a second dopant type, e.g., n-type, can be also formed on the substrate. Then the source region with the second dopant type and optionally a body contact region with the first dopant type is formed in the well of the first dopant type. The drain region with the second dopant type is formed in the doping drift region of the second dopant type. The source and drain regions are formed in the same process step 902.

A gate electrode is formed over the substrate between the source region and the drain region (904). A gate dielectric layer can be first formed on the substrate before the gate electrode is formed. The gate electrode can include a polysilicon layer. Sidewall spacers adjacent sidewalls of the gate electrode can be also formed on the substrate.

A first film is formed and laterally extends from over the gate electrode to over the doping drift region between the gate electrode and the drain region (906). The first film can include one or more dielectric layers that can include a silicide blocking layer.

A second film is formed and laterally extends over a portion of the doping drift region adjacent to the drain region (908). The second film can also include one or more dielectric layers.

A field plate is formed and laterally extends from over the first film to over the second film (910). The field plate can be conductive. For example, the field plate can include one or more conductive layers, e.g., a metal layer.

A first thickness defined vertically from a top surface of the gate electrode to a bottom surface of the field plate is smaller than a second thickness defined vertically from a top surface of the portion of the drift region to the bottom surface of the field plate. The first thickness includes a thickness of the first film and the second thickness includes a thickness of the second film.

The first film can laterally extend over the portion of the doping drift region, e.g., to abut the drain region. In this case, the first thickness is identical to the thickness of the first film, and the second thickness is no less than a sum of the thickness of the first film and the thickness of the second film.

In some implementations, the second film is formed over the first film. The process 900 can include forming a first conductive layer, e.g., metal silicide, selectively on the source region, the gate region, the drain region, and the second film. The field plate can be formed by forming the first conductive layer on the second film and forming a second conductive layer, e.g., metal, conformably over the first film and the first conductive layer on the second film, e.g., as illustrated in FIG. 2A-1. A polysilicon layer can be formed between the second film and the first conductive layer.

In some implementations, the gate electrode and the second film are formed in a same process step by sequentially forming a dielectric layer, e.g., $SiO_2$, and a conductive layer, e.g., polysilicon, selectively on a first portion of the drift region as the gate electrode and on a second portion of the drift region as the second film, and the first film is conformally formed over the gate electrode and the second film, e.g., as illustrated in FIG. 4A-1.

In some implementations, the first film is formed over one part of the second film, and a polysilicon layer is formed conformally over the first film. A metallic layer, e.g., metallic silicide, is formed over the polysilicon layer and the other part of the second film laterally abutting the one part of the second film and being adjacent to the drain region, e.g., as illustrated in FIG. 6A-1. The metallic layer can be also formed selectively on the source region, the gate electrode, and the drain region.

An inter-level dielectric (ILD) layer can be formed over the substrate. A number of metal contacts can be formed in the ILD layer and coupled to the source region, the drain region, and/or the gate electrode. A metal line layer can be then formed over the ILD layer and selectively coupled to one or more of the metal contacts. In some cases, the field plate is biased by a source voltage by coupling the field plate to the metal contact for the source region. In some cases, the field plate is biased by a gate voltage by coupling the field plate to the metal contact for the gate electrode.

In some implementations, the transistor device is configured to be a low-side switch, where the source region and the substrate have a same operation voltage. In some implementations, the transistor device is configured to be a high-side switch, where the source region and the substrate have different operation voltages, e.g., by adding a deep well with the second dopant type on the substrate as illustrated in FIG. 3B. In some implementations, the transistor device is configured to be a fully isolated switch, where the source region and the substrate have different operation voltages and the drain region and an N-ISO layer have different input voltages, e.g., by configuring the transistor device as illustrated in FIG. 3C.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A high voltage transistor device comprising:
a gate electrode disposed over a semiconductor substrate between a source region and a drain region;
a first film region laterally extending from over the gate electrode to over a first portion of a drift region laterally arranged between the gate electrode and the drain region, the first portion of the drift region being adjacent to the gate electrode and away from the drain region, the first film region comprising at least part of a first film disposed on a top surface of the first portion of the drift region;
a second film region laterally extending over a second portion of the drift region that is adjacent to the drain region and away from the gate electrode, the second film region comprising a second film that includes a conductive layer laterally separated from the drain region, the second portion of the drift region laterally abutting the first portion of the drift region; and
a field plate laterally extending from over the first film region to over the second film region,
wherein the first film is formed over the second film and under the field plate, and
wherein a first thickness defined vertically from the top surface of the first portion of the drift region to a bottom surface of the field plate is smaller than a second thickness defined vertically from a top surface of the second portion of the drift region to the bottom surface of the field plate, the first thickness including a thickness of the first film and the second thickness including at least a thickness of the second film.

2. The high voltage transistor device of claim 1, wherein the first film laterally extends over the first portion of the drift region and the second portion of the drift region, and
wherein the first thickness is identical to the thickness of the first film, and the second thickness is no less than a sum of the thickness of the first film and the thickness of the second film.

3. The high voltage transistor device of claim 1, wherein the conductive layer has a same thickness and a same material as the gate electrode.

4. The high voltage transistor device of claim 3, further comprising a first dielectric layer between the gate electrode and the drift region,
wherein the second film comprises a second dielectric layer between the conductive layer and the second portion of the drift region, and the second dielectric layer has a same material and a same thickness as the first dielectric layer.

5. The high voltage transistor device of claim 3, wherein the second film comprises a first portion covered by the first film and a second portion covered by a metallic layer, the second portion laterally abutting the first portion and closer to the drain region than the first portion.

6. The high voltage transistor device of claim 5, further comprising a polysilicon layer between the field plate and the first film,
wherein the field plate has a same material and a same thickness as the metallic layer.

7. The high voltage transistor device of claim 1, further comprising:
a source metallic contact coupled to the source region; and
a metallic line layer configured to couple the field plate to the source metallic contact.

8. The high voltage transistor device of claim 1, further comprising:

a gate metallic contact coupled to the gate electrode; and
a metallic line layer configured to couple the field plate to the gate metallic contact.

9. The high voltage transistor device of claim 1, configured to be one of a low-side switch, a high-side switch, and a fully isolated switch.

10. A method of fabricating a high voltage transistor device, the method comprising:
forming source and drain regions in a semiconductor substrate;
forming a gate electrode over the semiconductor substrate between the source region and the drain region;
forming a first film region laterally extending from over the gate electrode to over a first portion of a drift region laterally arranged between the gate electrode and the drain region, the first portion of the drift region being adjacent to the gate electrode and away from the drain region, the first film region comprising at least part of a first film disposed on a top surface of the first portion of the drift region;
forming a second film region laterally extending over a second portion of the drift region that is adjacent to the drain region and away from the gate electrode, the second film region comprising a second film that includes a conductive layer laterally separated from the drain region, the second portion of the drift region laterally abutting the first portion of the drift region; and
forming a field plate laterally extending from over the first film region to over the second film region,
wherein forming the first film region comprises forming the first film laterally extending over the first portion of the drift region and the second portion of the drift region,
wherein a first thickness defined vertically from the top surface of the first portion of the drift region to a bottom surface of the field plate is smaller than a second thickness defined vertically from a top surface of the second portion of the drift region to the bottom surface of the field plate, the first thickness including a thickness of the first film and the second thickness including at least a thickness of the second film, and
wherein the first thickness is identical to a thickness of the first film, and the second thickness is no less than a sum of the thickness of the first film and a thickness of the second film.

11. The method of claim 10, wherein the thickness of the first film is determined based on at least one of a predetermined breakdown voltage, a doping concentration of the drift region, or a drift length from the gate electrode to the drain region,
wherein the thickness of the second film is determined based on the thickness of the first film, the predetermined breakdown voltage, the doping concentration of the drift region, the drift length, or an on-resistance of the transistor device, and
wherein the first film and the second film are configured such that a substantially uniform electric field is formed on the field plate and a breakdown voltage of the transistor device is higher than the predetermined breakdown voltage.

12. The method of claim 10, wherein forming the second film region comprises forming the second film over the first film,
wherein the method comprises forming a first conductive layer selectively on the source region, the gate region, the drain region, and the second film, and wherein forming the field plate comprises forming the first conductive layer on the second film and forming a second conductive layer conformally over the first film and the first conductive layer on the second film.

13. The method of claim 10, wherein forming the gate electrode and the second film comprises:
sequentially forming a dielectric layer and a conductive layer selectively on the first portion of the drift region as the gate electrode and on the second portion of the drift region as the second film, and
wherein forming the first film comprises forming the first film over the second film.

14. The method of claim 13, wherein forming the first film comprises forming the first film on one part of the second film,
wherein the method comprises forming a polysilicon layer over the first film, and
wherein forming the field plate comprises forming a metallic layer over the polysilicon layer and the other part of the second film laterally abutting the one part of the second film and being adjacent to the drain region.

15. The method of claim 10, further comprising:
forming a metal contact coupled to one of the source region and the gate electrode; and
forming a metal line layer coupling the metal contact to the field plate.

16. A high voltage transistor device comprising:
a source region in a well of a first dopant type in a semiconductor substrate;
a doping drift region of a second dopant type in the semiconductor substrate;
a drain region of the second dopant type in the doping drift region;
a gate electrode disposed via a gate dielectric layer over the semiconductor substrate between the source region and the drain region;
a first film region laterally extending from over the gate electrode to over a first portion of the doping drift region between the gate electrode and the drain region, the first portion of the doping drift region being adjacent to the gate electrode and away from the drain region, wherein the first film region comprises at least a part of a first film disposed on a top surface of the first portion of the doping drift region;
a second film region laterally extending over a second portion of the doping drift region, wherein the second portion of the doping drift region laterally abuts the first portion of the doping drift region at a first end and is adjacent to the drain region at a second end, wherein the second film region comprises a second film that includes a conductive layer laterally separated from the drain region;
a field plate laterally extending from over the first film region to over the second film region; and
a metal line layer coupling the field plate to one of the source region and the gate electrode,
wherein the first film is formed over the second film and under the field plate, and
wherein a first thickness is defined vertically from the top surface of the first portion of the drift region to a bottom surface of the field plate, the first thickness comprising a thickness of the first film, wherein a second thickness is defined vertically from a top surface of the second portion of the doping drift region to the bottom surface of the field plate, the second thickness comprising at least a thickness of the second film, and wherein the second thickness is larger than the first thickness.

17. The high voltage transistor device of claim 16, wherein the conductive layer has a same thickness and a same material as the gate electrode,
wherein the high voltage transistor device further comprises a first dielectric layer between the gate electrode and the drift region, and
wherein the second film comprises a second dielectric layer between the conductive layer and the second portion of the drift region, and the second dielectric layer has a same material and a same thickness as the first dielectric layer.

18. The high voltage transistor device of claim 17, wherein the second film comprises a first portion covered by the first film and a second portion covered by a metallic layer, the second portion laterally abutting the first portion and closer to the drain region than the first portion,
wherein the high voltage transistor device further comprises a polysilicon layer between the field plate and the first film, and wherein the field plate has a same material and a same thickness as the metallic layer.

19. The high voltage transistor device of claim 16, further comprising:
a source metallic contact coupled to the source region;
a gate metallic contact coupled to the gate electrode;
a first metallic line layer configured to couple the field plate to the source metallic contact; and
a second metallic line layer configured to couple the field plate to the gate metallic contact.

20. The high voltage transistor device of claim 16, configured to be one of a low-side switch, a high-side switch, and a fully isolated switch.

* * * * *